US011092629B2

(12) United States Patent
Clark et al.

(10) Patent No.: US 11,092,629 B2
(45) Date of Patent: Aug. 17, 2021

(54) TECHNIQUES FOR ANALYSIS OF DATA FROM SMART METERS

(71) Applicant: Sacramento Municipal Utility District, Sacramento, CA (US)

(72) Inventors: Remington Clark, Citrus Heights, CA (US); Jeff Berkheimer, Rancho Murieta, CA (US); Sheikh Hassan, Elk Grove, CA (US)

(73) Assignee: Sacramento Municipal Utility District, Sacramento, CA (US)

( * ) Notice: Subject to any disclaimer, the term of this patent is extended or adjusted under 35 U.S.C. 154(b) by 92 days.

(21) Appl. No.: 16/114,096

(22) Filed: Aug. 27, 2018

(65) Prior Publication Data

US 2020/0064385 A1    Feb. 27, 2020

(51) Int. Cl.
*G01R 22/06* (2006.01)
*G01R 22/10* (2006.01)

(52) U.S. Cl.
CPC ......... *G01R 22/066* (2013.01); *G01R 22/063* (2013.01); *G01R 22/10* (2013.01)

(58) Field of Classification Search
CPC .... G01R 22/063; G01R 22/066; G01R 22/10; G06Q 50/06
See application file for complete search history.

(56) References Cited

U.S. PATENT DOCUMENTS

| | | | |
|---|---|---|---|
| 2012/0038357 A1* | 2/2012 | Brandon | G01N 27/82 324/251 |
| 2015/0052088 A1 | 2/2015 | Arya et al. | |
| 2016/0117326 A1 | 4/2016 | Steigler | |
| 2016/0131501 A1 | 5/2016 | Steigler | |
| 2016/0352103 A1 | 12/2016 | Aiello et al. | |
| 2017/0038415 A1 | 2/2017 | Dasgupta et al. | |
| 2017/0180831 A1 | 6/2017 | Wang | |
| 2018/0356449 A1* | 12/2018 | Leonard | G01R 21/133 |

FOREIGN PATENT DOCUMENTS

| | | | | |
|---|---|---|---|---|
| CN | 109190672 A | * | 1/2019 | G06K 9/62 |
| WO | 2010083334 | | 7/2010 | |
| WO | 2018027180 | | 2/2018 | |

OTHER PUBLICATIONS

Wenyu Wang, et al., "Advanced Metering Infrastructure Data Driven Phase Identification in Smart Grid," GREEN 2017—The Second International Conference on Green Communications, Computing and Technologies, Sep. 2017, pp. 16-23.

(Continued)

*Primary Examiner* — Noam Reisner
(74) *Attorney, Agent, or Firm* — InventIQ Legal LLP; Steven J. Cahill

(57) ABSTRACT

A computer system analyzes data from smart meters. The computer system can, for example, analyze the data from a smart meter to determine if the smart meter is connected to a different distribution transformer, if the smart meter is at a customer site where power theft is occurring, if the smart meter is located at a customer site having a solar photovoltaic system, if the smart meter is located at a customer site having an electric vehicle, or if the smart meter is located at a grow house.

23 Claims, 13 Drawing Sheets

(56) References Cited

OTHER PUBLICATIONS

Wenyu Wang, et al., "Phase Identification in Electric Power Distribution Systems by Clustering of Smart Meter Data," 15th IEEE International Conference on Machine Learning and Applications (ICMLA), pp. 1-7, Anaheim, CA, 2016.

Jayadev P, Satya, et al., "Identifying Topology of Power Distribution Networks Based on Smart Meter Data," Cornell University Library, Sep. 9, 2016, pp. 1-8.

Korean Intellectual Property Office, "International Search Report," for International application No. PCT/US2019/044733, dated Jan. 20, 2020 , p. 1-4.

Korean Intellectual Property Office, "Written Opinion of the International Searching Authority," for International application No. PCT/US2019/044733, dated Jan. 20, 2020, p. 1-6.

\* cited by examiner

TECHNIQUES FOR ANALYSIS OF DATA FROM SMART METERS

FIELD OF THE DISCLOSURE

The present disclosure relates to techniques for analysis of data from smart meters that receive electric power from an electric distribution system.

BACKGROUND

An electric meter is a device that monitors the amount of electric power drawn from an electric distribution system at a customer site. One type of electric meter that is used to monitor a customer's electric power consumption from an electric distribution system is an electric smart meter (also referred to herein as a smart meter). Smart meters monitor electric power usage, electric current, and/or voltage at customer sites that are connected to the electric distribution system. Smart meters can also monitor the amount of electric power and/or electric current provided from customer sites to the electric distribution system. Smart meters automatically transmit electric power usage and voltage data from customer sites to the electric utility that provides electric power to the customer sites. Smart meters may be part of an advanced metering infrastructure (AMI) or an automatic meter reading (AMR) system.

DETAILED DESCRIPTION

Figure 1:
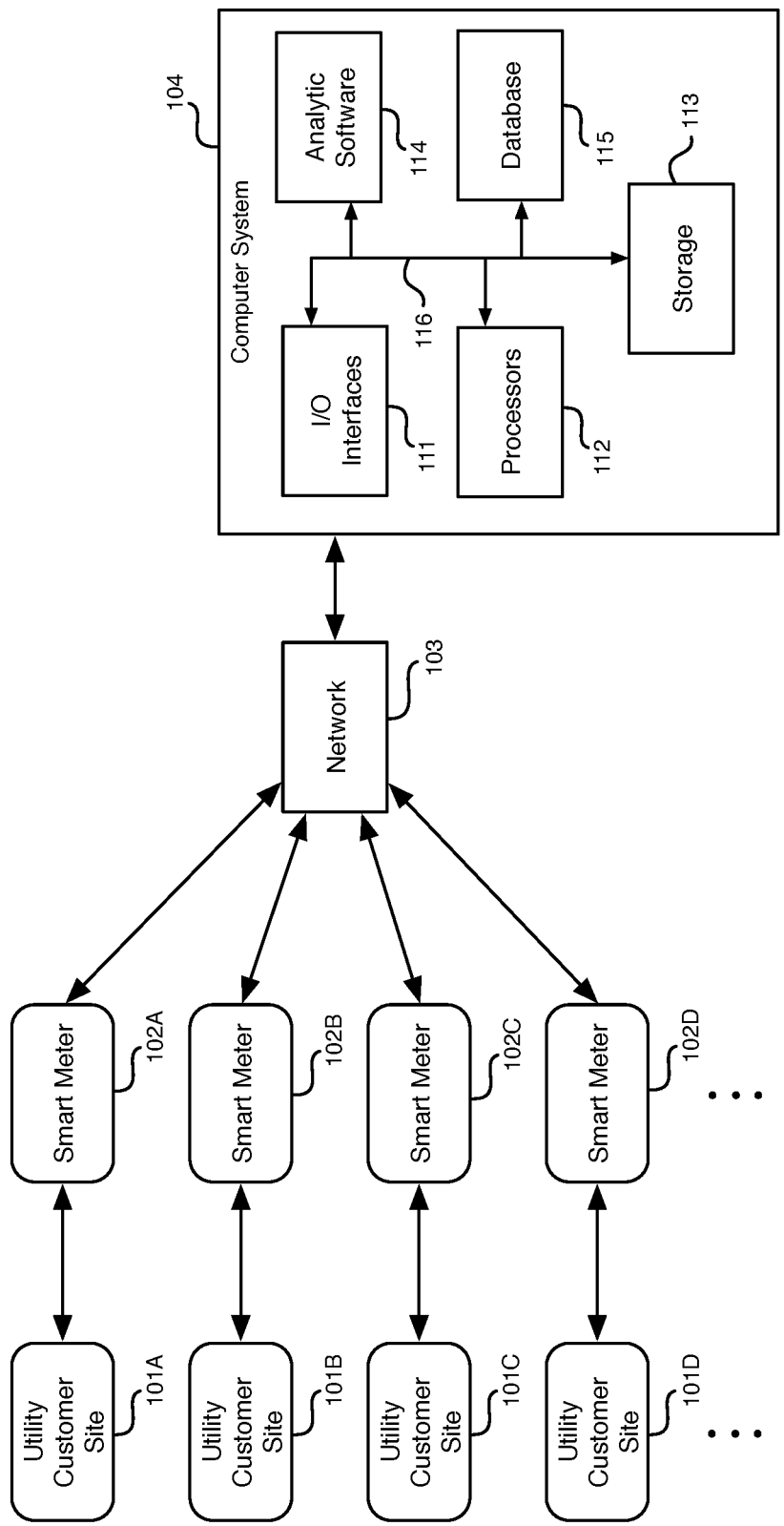
FIG. 1 is a diagram illustrating a system that uses smart meters to measure voltages, electric current, and electric power usage at utility customer sites, according to an embodiment.

Electric utilities face challenges in identifying and maintaining accurate information regarding the connections of the components in their electric distribution systems. An electric distribution system is also referred to herein as an electric grid. An electric utility ideally has accurate connection information that indicates how the customer sites that receive electric power (i.e., electricity) from the utility are interconnected downstream of each power distribution substation. The connection information should accurately indicate the customer sites that are connected via utility distribution lines to each distribution transformer that is connected downstream of each power distribution substation.

A common issue faced by electric utilities is maintaining accurate connection information about their electric distribution systems. The connections between utility customer sites and distribution transformers may change during maintenance or repair of the electric distribution system. For example, emergency repairs made to an electric distribution system during restoration of electric service after an outage may change connections between customers and distribution transformers. New meter to transformer connection errors may be unintentionally introduced into an electric distribution system as compared to a utility's connection information after emergency rebuilding of the electric distribution system during storms, incorrect construction which does not match the job as designed, data errors introduced during geographical information system (GIS) mapping, etc.

The information that an electric utility has about connections between customer sites and distribution transformers may become less accurate over time when compared to the connections between customer sites and distribution transformers that exist in the electric distribution system. It can be difficult to track all of the changes to the electric grid that occur over time to maintain accurate connection information. An electric utility may not be able to trace each underground utility line to identify which distribution transformer each customer's electric meter is connected to. Visual inspection of each customer's electric meter is typically expensive, slow, and labor intensive.

An electric utility may collect utility data for a set of electric meters (e.g., smart meters) that is associated with each distribution transformer in an electric grid. The utility data may include, for example, information collected on at least an hourly basis for each electric meter connected to a distribution transformer. The utility data may include an hourly average voltage for each electric meter and hourly power consumption data for each electric meter.

The theft of power from an electric grid that distributes electricity to customers is often a major source of lost revenue for electric utilities. Because electricity may be stolen at several endpoints of a large electric grid, it can be difficult to identify each source of power theft. As an example, some utility customers have been known to connect illegal bypass lines around their electric meters in order to steal electricity from an electric grid. The bypass line is intended to prevent the electric meter from sensing at least a portion of the customer's electricity usage. Thus, a bypass line may prevent an electric meter from accurately monitoring the electricity consumption at a customer site.

The voltage sensed by an electric meter at a customer site changes in response to changes in the electric power drawn by the customer site from the electric grid. For example, if a customer's electricity consumption from an electric grid increases, the electric meter at that customer site senses a lower voltage. If a customer's electricity consumption decreases, the electric meter senses a greater voltage. If a bypass line is illegally connected around an electric meter, the electric meter may not sense all of the electric power that is being drawn by the load at the customer site. However, the electric meter will sense changes in the voltage that are caused by changes in the electric power being drawn by the load at the customer site, even if a bypass line is connected around the electric meter. If power theft is occurring at a customer site, the electric meter at that customer site may generate a significantly different voltage profile than the voltage profiles generated by the electric meters at other customer sites in the same geographic area and/or that are connected to the same distribution transformer, due to the impedance in the distribution lines between the electric meters.

Thus, the voltage profile sensed by an electric meter at a customer site may be indicative of power theft from the electric grid. As an example, if a customer site is drawing more power from an electric grid during some hours of each day than other customer sites that are connected to the same transformer in the electric grid and/or are in the same geographic area, an electric meter at the customer site will indicate that the voltage is decreasing more during these hours than the voltages sensed by the electric meters at the other customer sites.

According to some embodiments disclosed herein, voltage data from smart meters are monitored to determine the possible occurrence of power theft at one or more customer sites. If anomalies are identified in voltage data from a customer's smart meter compared to other customer's smart meters that are connected to the same distribution transformer or are in the same geographic area, the customer's smart meter may be flagged for further investigation. One possible cause for anomalies in voltage data is that the utility's connection information may be inaccurate for the reasons discussed above, and the smart meter sensing the anomalies in the voltage data is connected to a different distribution transformer than the utility's connection information currently indicates. Another possibility is that the anomalies in the voltage data are caused by theft of power from the electric grid at the customer site.

FIG. 1 is a diagram illustrating a system that uses smart meters to measure voltages, electric current, and electricity usage at utility customer sites, according to an embodiment. In the embodiment of Figure (FIG. 1, utility customer sites 101A, 101B, 101C, and 101D (collectively referred to herein as utility customer sites 101) associated with smart meters 102A, 102B, 102C, and 102D (collectively referred to herein as smart meters 102), respectively, are connected through a network 103 to a computer system 104. Each of the smart meters 102 is connected to receive electric power from an electric grid and is connected to provide the electric power to an associated one of the customer sites 101. The electric grid is not shown in FIG. 1. Four utility customer sites 101 and four associated smart meters 102 are shown in FIG. 1 as examples. Although it should be understood that an electric grid is typically connected to provide electric power to hundreds, thousands, or even millions of customer sites. Each of the customer sites 101 has an electric meter, such as a smart meter, that monitors electricity usage and voltage.

Each of the smart meters 102 periodically sends measurements of voltages (i.e., voltage data), electric current, and/or electricity consumption through network 103 to computer system 104 for processing. Each of the smart meters 102 measures the voltage at its connection to the electric grid at the associated customer site 101. As an example, each of the smart meters 102 may send the voltage data to computer system 104 each hour of each day. Communications of data from the smart meters 102 to the computer system 104 may be through wireless connections, wires, power lines, or any combination thereof in network 103.

Computer system 104 includes one or more input/output (I/O) interfaces 111, one or more processor devices 112, one or more storage devices 113, analytic software 114, and one or more databases 115. The components 111-115 of the computer system 104 can communicate through connections 116. Computer system 104 may, for example, be located at a facility that is operated by the electric utility. Processors 112 may include any processing circuit or device, such as, for example, a CPU (central processing unit), microprocessor, graphics processing unit (GPU), field programmable gate array, and/or other forms of processor circuitry. Storage 113 may include memory devices such as solid state devices, disc storage devices, magnetic tape, etc. The storage devices 113 may be organized into any suitable configuration, for example, a storage area network. The input/output interfaces 111 may include, for example, devices for inputting data to the processors 112 (e.g., a mouse and a keyboard), and a mechanism for providing results from the processors 112 (e.g., printers and computer monitors).

The voltage, current, and/or power usage data provided from smart meters 102 through network 103 may be stored in storage devices 113 in computer system 104. The analytic software 114 can access the voltage, current, and/or power usage data stored in storage devices 113 using database 115. The analytic software 114 can analyze the voltage, current, and/or the power usage data and generate the results disclosed herein. Analytic software 114 can be stored in memory. Analytic software 114 can be run on one or more processors 112. One or more users may interface with the analytic software 114 using one or more I/O interfaces 111.

Figure 2A:
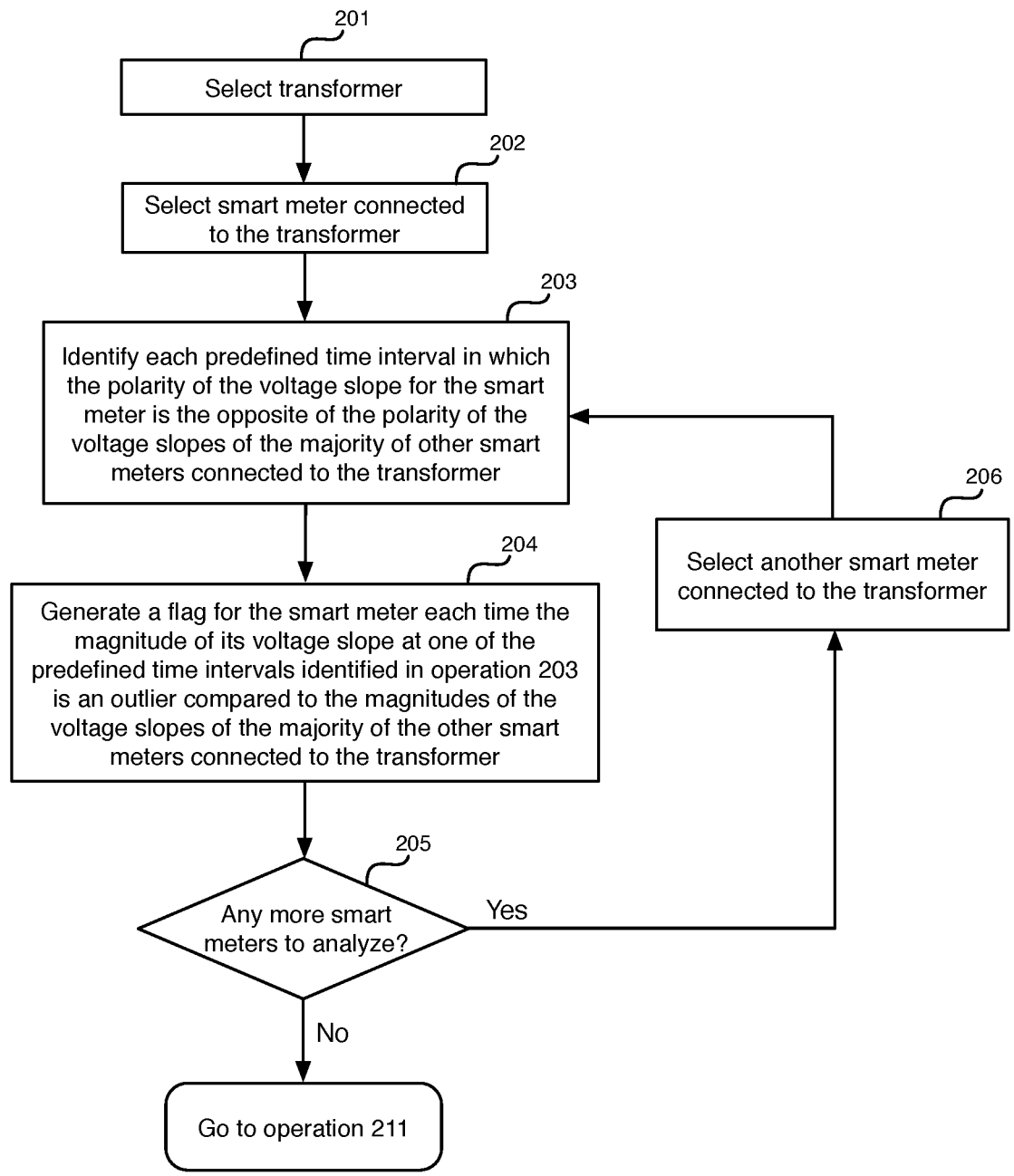
FIGS. 2A-2B are flow charts illustrating examples of operations that can be used to identify outliers in voltage data received from smart meters that are connected to an electric distribution system, according to an embodiment.
Figure 2B:
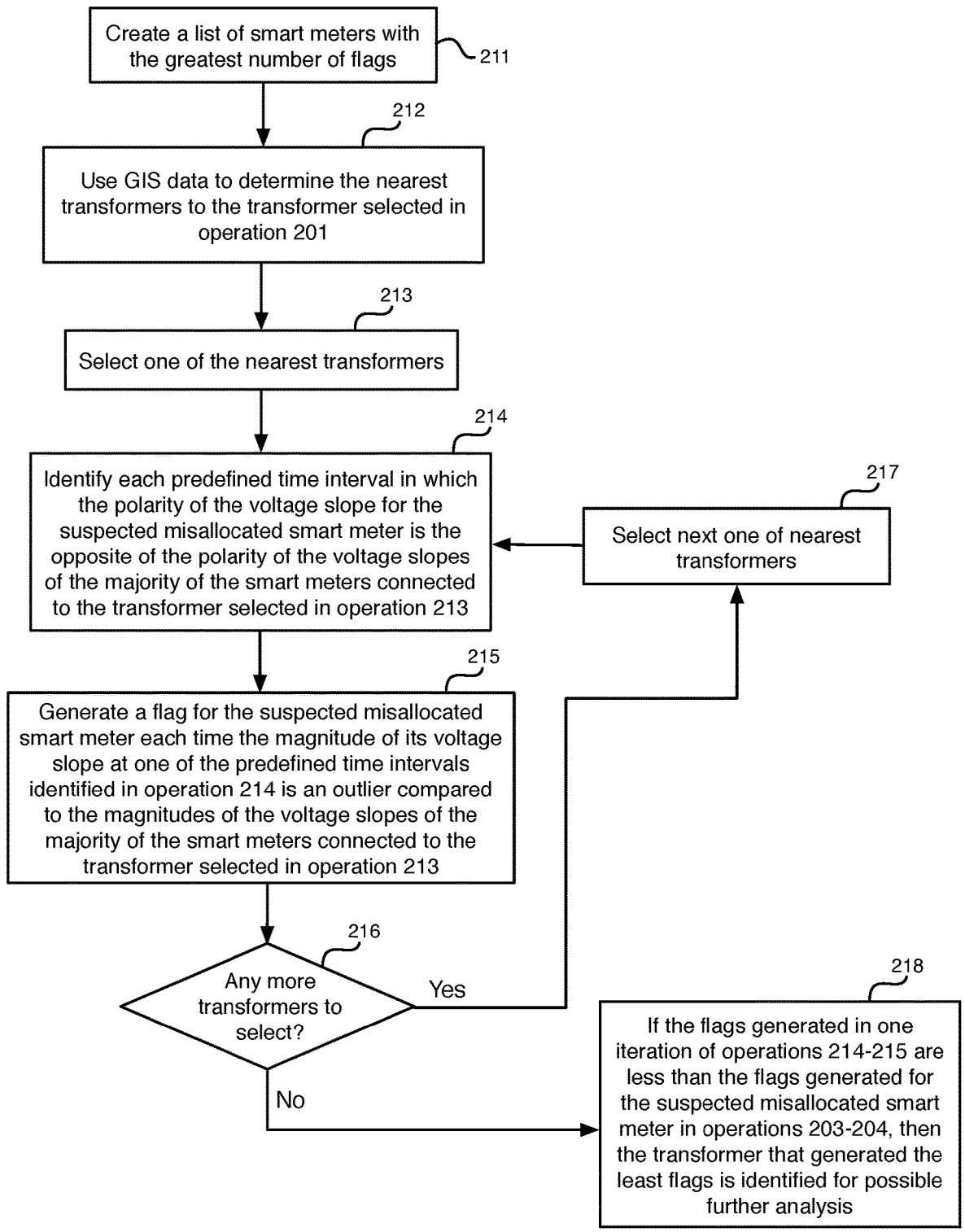

FIGS. 2A-2B are flow charts illustrating examples of operations that can be used to identify outliers in voltage data received from smart meters that are connected to an electric grid, according to an embodiment. The operations of FIGS. 2A-2B may, for example, be performed as one check of multiple checks that are performed to identify outliers in voltage data received from smart meters. Alternatively, the operations of FIGS. 2A-2B may be performed alone without additional checks.

In the embodiment of FIGS. 2A-2B, each of the smart meters 102 is connected to a distribution transformer in the electric grid through one or more utility distribution lines, such as a lateral and/or a feeder. The operations of FIGS. 2A-2B may, for example, be performed by the analytic software 114 in computer system 104 using I/O interfaces 111, processors 112, storage devices 113, and database 115 shown in FIG. 1.

Initially, time series voltage data (also referred to herein as voltage data) generated by smart meters connected to an electric grid is collected from storage 113 using database 115 and provided to the analytic software 114. Also, geographical information system (GIS) data that maps electric meter to distribution transformer connections and distribution lines in the electric grid is collected. In operation 201, a distribution transformer (also referred to herein merely as a transformer) connected to the electric grid is selected. The transformer selected in operation 201 is one of the transformers that the GIS data indicates is connected to a set of the smart meters from which the voltage data was collected. The transformer may be selected automatically by the analytic software 114 or in response to user input. Additional iterations of the operations of FIGS. 2A-2B may be performed for the smart meters that are connected to the other transformers to be evaluated in the electric grid.

In operation 202, a smart meter is selected that is connected to the transformer selected in operation 201. Operation 202 may determine which smart meters are connected to the transformer selected in operation 201 using the GIS data that indicates the meter to transformer connections. A smart meter is connected to a transformer if the smart meter receives power from the electric grid through the transformer, even if the smart meter is not directly connected to the transformer. The power provided from the electric grid through the transformer to the smart meter is received at a load at the utility customer site. Each distribution transformer in an electric grid is typically connected to and transmits power to multiple smart meters at multiple customer sites. As an example that is not intended to be limiting, each distribution transformer may be connected to 6-12 smart meters.

As discussed above, an electric utility's GIS data about its electric grid may contain some inaccurate information about which smart meters are connected to which distribution transformers. The operations of FIGS. 2A-2B can help identify the existence of inaccurate connection information between smart meters and transformers in the GIS data.

Operations 203-204 in FIG. 2A and operations 214-215 in FIG. 2B are performed using the voltage data collected from the smart meters. The time series voltage data from each of the smart meters is plotted as a voltage waveform that varies over time. The slope of each voltage waveform generated using the time series voltage data from a smart meter is then determined at predefined time intervals (e.g., hourly). The slopes of the voltage waveforms generated using the time series voltage data from the smart meters are also referred to herein as voltage slopes.

In operation 203, each predefined time interval is identified in which the polarity of the voltage slope for the smart meter selected in operation 202 is the opposite of the polarity of the voltage slopes of the majority of the other smart meters connected to the transformer selected in operation 201. Operation 203 is repeated in each time interval, for example, every hour, every half hour, every 15 minutes, etc. using the voltage data over a predefined time period (e.g., days, a week, a month, or several months).

In operation 204, a flag is generated for the smart meter selected in operation 202 each time the magnitude of its voltage slope at one of the predefined time intervals identified in operation 203 is an outlier compared to the magnitudes of the voltage slopes of the majority of the other smart meters connected to the transformer. A flag is only generated for the smart meter in operation 204 if the condition analyzed in operation 203 was met at the respective predefined time interval.

In some situations, too many flags may be generated if only the polarity of the voltages slopes of the voltage waveforms are compared to each other, and operation 204 is omitted. For example, if the voltage waveform for one smart meter goes slightly positive, while the voltage waveforms for the other smart meters go slightly negative, flags would be generated if only the polarities of the voltage slopes were compared. By also comparing the magnitudes (i.e., absolute values) of the voltage slopes in operation 204, flags are not generated in these situations. As a more specific example, the voltage slopes of three smart meters may be −0.3, and the voltage slope of a fourth smart meter may be 0.29. In this example, no flags are generated in operation 204, because the magnitude of the voltage slope of the fourth smart meter is not an outlier. Thus, operation 204 can avoid the problem of false flags being generated when the polarity of the voltage slope of the smart meter selected in operation 202 is the opposite of the polarity of the voltage slopes of the majority of the other smart meters, but the magnitude of the voltage slope of the smart meter selected in operation 202 is not an outlier compared to the magnitudes of the voltage slopes of the majority of the other smart meters.

The magnitude of the voltage slope for a smart meter may be defined as an outlier in operation 204 if it is greater than or less than the magnitudes of the voltage slopes of the majority of the other smart meters by a predefined threshold. Dixon's Q test is an example of an equation that can be used to identify the magnitude of the voltage slope for the smart meter as an outlier in operation 204. Dixon's Q test performs a test for an outlier based on the chi squared distribution of the squared differences between data and the sample mean. To apply Dixon's Q test, a data set is arranged in order of increasing values, and a questionable point Q is calculated as $$Q = \frac{\text{Gap}}{\text{Range}}.$$

In Dixon's Q test, Gap is defined as the absolute difference between the outlier in question and the closest number in the data set to the outlier in question, and Range is the range of values of the data set. If $Q > Q_{Table}$, where $Q_{Table}$ is a reference value that corresponds to the sample size and the confidence level, then the questionable point Q is identified as an outlier in operation 204. Only one point can be rejected from a data set using a Dixon's Q test. The flags generated in operation 204 are counted over the predefined time period to generate a total number of flags. The analytic software 114 may, for example, store the flags generated for the smart meter in operation 204 in database 115.

Figure 3A:
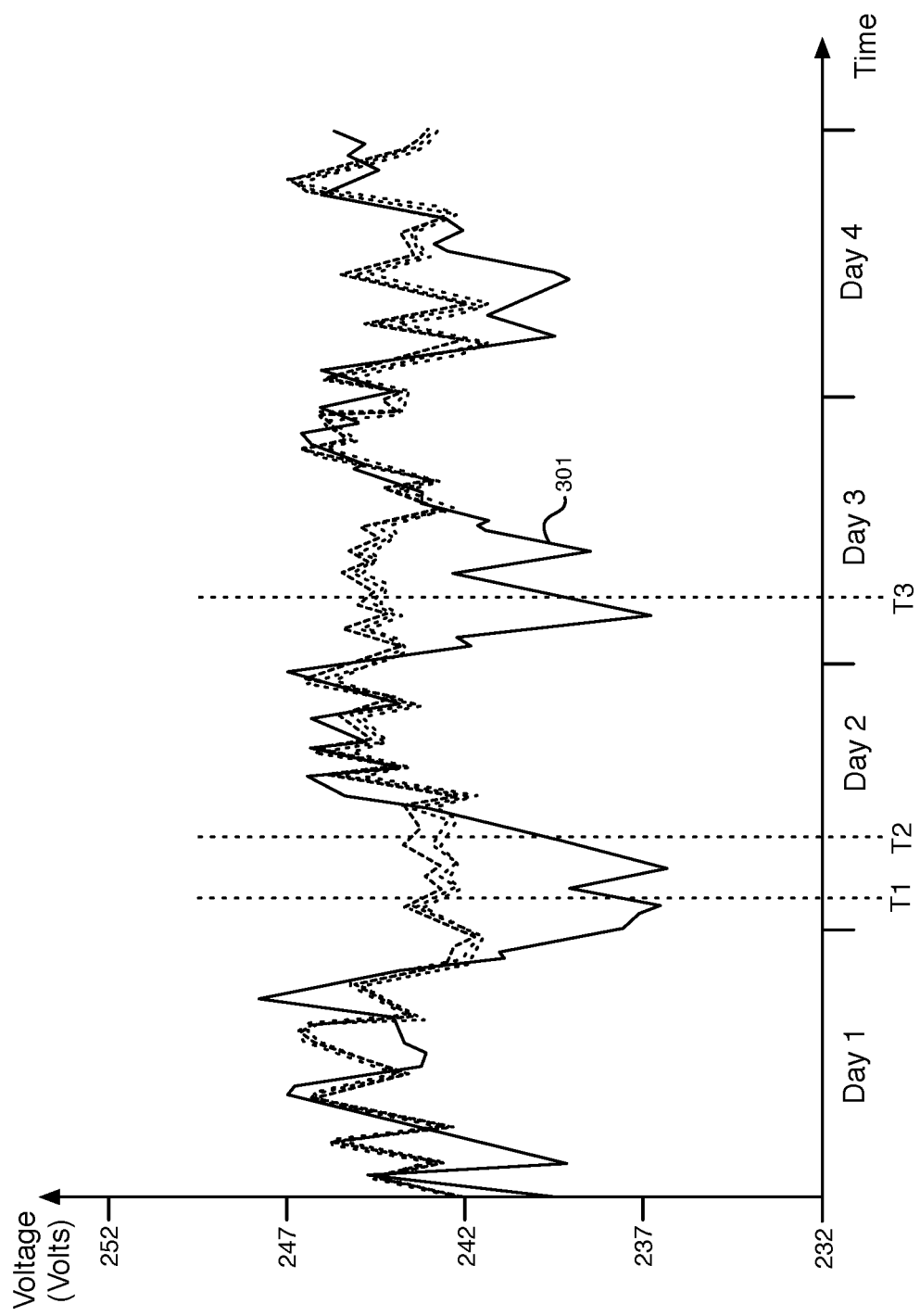
FIG. 3A is a graph of hourly voltage data from four smart meters over four days, according to an exemplary embodiment.

FIG. 3A is a graph of hourly voltage data from four smart meters over four days, according to an exemplary embodiment. The voltage data from each of the four smart meters is plotted as a voltage waveform. Each of the 4 voltage waveforms shown in FIG. 3A plots voltage data from a different one of the four smart meters that are all connected to and receive power from an electric grid. In the embodiment of FIG. 3A, the four smart meters are analyzed together, because the GIS data indicates that these four smart meters are all connected to the electric grid through the same distribution transformer. The solid line waveform 301 represents the voltage data from one of the smart meters. The three dotted line waveforms represent the voltage data from the other three smart meters. As can be seen in FIG. 3A, the solid line voltage waveform 301 deviates from the three dotted line voltage waveforms over several hours of the four day period shown in FIG. 3A.

The graph of FIG. 3A illustrates examples of how operations 203-204 can be applied to voltage data from four smart meters. For example, if the operations of FIGS. 2A-2B are applied to the voltage data graphed in FIG. 3A, a flag is generated at each of times T1, T2, and T3 in operation 204. At each of the times T1-T3 in FIG. 3A, the polarity of the voltage slope of the solid line waveform 301 is the opposite of the polarity of the voltage slopes of the 3 dotted line waveforms. Also, at each of times T1-T3, the magnitude of the voltage slope of the solid line waveform 301 is an outlier compared to the magnitudes of the voltage slopes of the 3 dotted line waveforms.

Figure 3B:
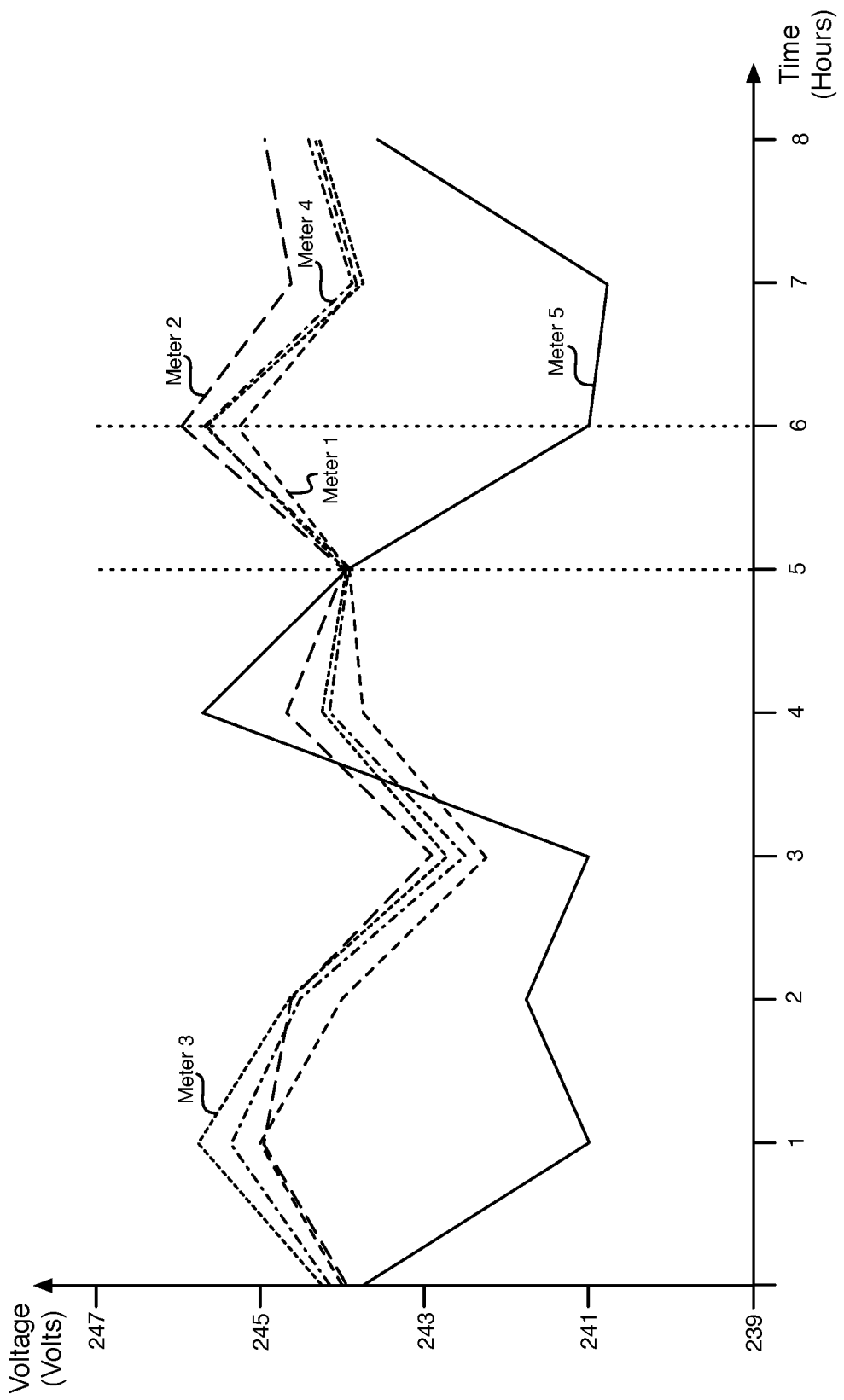
FIG. 3B is a graph of hourly voltage data from five smart meters over eight hours, according to another exemplary embodiment.

FIG. 3B is a graph of hourly voltage data from five smart meters over eight hours, according to another exemplary embodiment. In FIG. 3B, hourly voltage data from each of the smart meters is plotted as a voltage waveform. Each of the 5 voltage waveforms shown in FIG. 3B plots the hourly voltage data from a different one of the five smart meters that are all connected to and receive power from an electric grid. In the embodiment of FIG. 3B, the five smart meters are analyzed together, because the GIS data indicates that these smart meters are all connected to the electric grid through the same distribution transformer. The solid line waveform represents the voltage data from one of the smart meters that is referred to herein and in FIG. 3B as meter 5. The four dotted line waveforms represent the voltage data from the other four smart meters that are referred to herein and in FIG. 3B as meters 1-4.

The computer system determines the voltage slopes of the five voltage waveforms shown in FIG. 3B for the five smart meters at each hour. Eight hours of voltage data for the smart meters are shown in FIG. 3B merely as an example. It should be understood that the computer system can determine voltage data for many more smart meters over longer periods of time, such as days, weeks, months, or years. Table 1 below contains the voltages and the voltage slopes of the exemplary voltage data from the five smart meters at hours 5 and 6, which are shown in FIG. 3B.

TABLE 1

| Meter | Voltage at Hour 5 | Voltage at Hour 6 | Voltage Slope | Magnitude of Voltage Slope |
|---|---|---|---|---|
| 1 | 244 | 245.23 | 1.23 | 1.23 |
| 2 | 244 | 245.95 | 1.95 | 1.95 |
| 3 | 244 | 245.7 | 1.7 | 1.7 |
| 4 | 244 | 245.7 | 1.7 | 1.7 |
| 5 | 244 | 241 | −3 | 3 |

As shown in Table 1, meters 1-4 have positive voltage slopes between hours 5 and 6, and meter 5 has a negative voltage slope between hours 5 and 6. In addition, the magnitudes of the voltage slopes of meters 1-4 are in the range of 1.23-1.95 between hours 5 and 6, and the magnitude of the voltage slope of meter 5 is 3 between hours 5 and 6. Based on the values in Table 1, meter 5 may be flagged as an outlier in operation 204 when compared to meters 1-4 for the 1 hour time interval between hour 5 and hour 6.

In decision operation 205, a determination is made as to whether there are any more smart meters to analyze that are connected to the same transformer selected in operation 201 and that have not been analyzed in previous iterations of operations 203-204. If there are more smart meters connected to the transformer that have not been analyzed yet, one of the smart meters that has not been analyzed in a previous iteration of operations 203-204 is selected in operation 206 using the GIS data.

Then, operations 203-204 are repeated using the voltage data from the smart meter selected in operation 206. Operations 203-206 are then repeated for each of the other smart meters connected to the transformer selected in operation 201. Thus, an iteration of operations 203-204 is performed for each of the smart meters connected to the transformer. Each iteration of operations 203-204 generates a set of flags for one of the smart meters that indicate if the voltage data from that smart meter is an outlier compared to the voltage data from the majority of other smart meters connected to the transformer.

If all of the smart meters connected to the transformer selected in operation 201 have been analyzed at the current iteration of operation 205, then the process of FIG. 2A proceeds to operation 211, which is shown in detail in FIG. 2B. Referring now to FIG. 2B, in operation 211, a list of the one or more smart meters having the greatest number of flags from the iterations of operation 204 is created. The list generated in operation 211 includes the smart meter having the greatest number of flags generated in the previous iterations of operation 204. The list generated in operation 211 may, for example, rank the smart meters from highest to lowest number of flags.

The smart meter having voltage data that generates the most flags in one of the previous iterations of operation 204 may, for example, be identified as a suspected misallocated smart meter in operation 211. In operation 212, the geographical information system (GIS) data is then used to determine the nearest distribution transformers to the distribution transformer selected in operation 201. As a specific example that is not intended to be limiting, the 5 nearest transformers to the transformer selected in operation 201 may be identified in operation 212. The nearest transformers may be determined in operation 212 using physical distances in the electric grid that are indicated by the GIS data.

Figure 4:
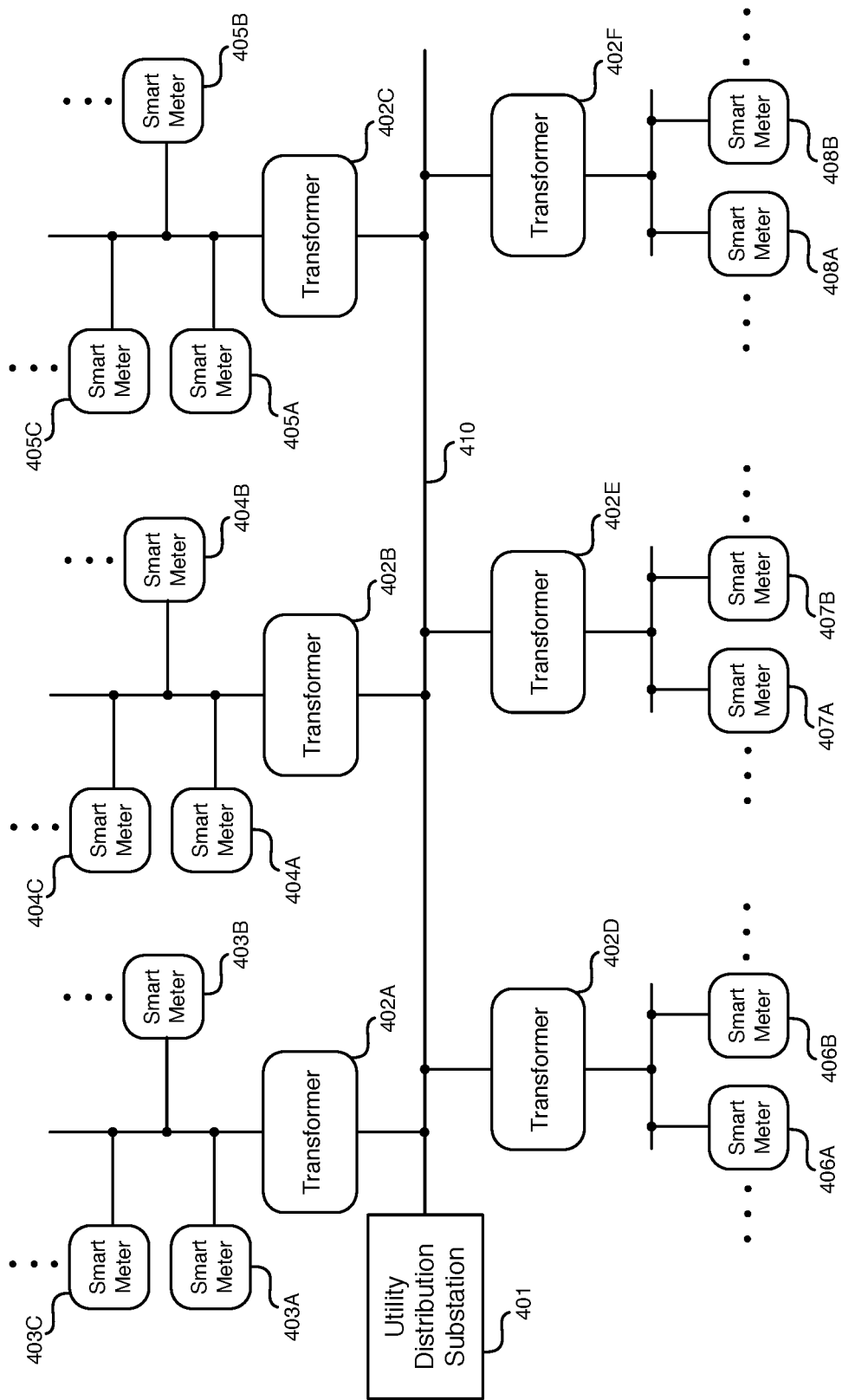
FIG. 4 is a diagram that shows examples of connections between a utility distribution substation and six distribution transformers in an electric distribution system, according to an embodiment.

FIG. 4 is a diagram that shows examples of connections between a utility distribution substation and 6 distribution transformers in an electric grid, according to an embodiment. In the embodiment of FIG. 4, utility distribution substation 401 provides electric power through electricity distribution lines 410 and distribution transformers 402A-402F to customer sites via smart meters 403-408, respectively. Transformers 402A-402F are connected to and provide electric power to smart meters 403A-403C, 404A-404C, 405A-405C, 406A-406B, 407A-407B, and 408A-408B, respectively. Although 2 or 3 smart meters are shown in FIG. 4 as being connected to each of the transformers 402A-402F, each transformer 402 in the electric grid may be connected to additional smart meters.

FIG. 4 may not indicate accurate relative physical distances between the utility distribution station, the transformers, and the smart meters. However, the diagram of FIG. 4 may be used to determine which of the distribution transformers in the electric grid are the nearest transformers to the transformer that is connected to a suspected misallocated smart meter in operation 212. As an example, if smart meter 404B is the suspected misallocated smart meter, the 5 nearest transformers to transformer 402B are identified as transformers 402A and 402C-402F in operation 212 using the diagram of FIG. 4.

In operation 213, one of the nearest transformers that was identified in operation 212 is selected. Subsequently, in operations 214-215, the voltage data from the suspected misallocated smart meter is compared to the voltage data from the smart meters that are connected to the transformer selected in operation 213. As an example, the voltage data from smart meter 404B may be compared to the voltage data from smart meters 403A-403C that are connected to transformer 402A in operations 214-215.

In operation 214, each predefined time interval is identified in which the polarity of the voltage slope for the suspected misallocated smart meter identified in operation 211 is the opposite of the polarity of the voltage slopes of the majority of the smart meters connected to the transformer selected in operation 213. Operation 214 is repeated in each time interval, for example, every hour, every half hour, etc. using the voltage data over a predefined time period (e.g., over a week, a month, etc.).

In operation 215, a flag is generated for the suspected misallocated smart meter each time the magnitude of its voltage slope at one of the predefined time intervals identified in operation 214 is an outlier compared to the magnitudes of the voltage slopes of the majority of the smart meters connected to the transformer selected in operation 213. A flag is only generated for the suspected misallocated smart meter in operation 215 if the condition analyzed in operation 214 was met at the respective predefined time interval. The flags generated in operation 215 are counted over the predefined time period to generate a total number of flags. The magnitude of the voltage slope of the suspected misallocated smart meter may be identified as an outlier in operation 215 if the magnitude is greater than or less than the magnitudes of the voltage slopes of the majority of the smart meters connected to the transformer selected in operation 213 by a threshold. Dixon's Q test described above with respect to operation 204 is also an example of an equation that can be used to identify the magnitude of the voltage slope of the suspected misallocated smart meter as an outlier in operation 215. The examples disclosed in FIGS. 3A-3B are also examples of how flags may be generated in operation 215.

In decision operation 216, a determination is made as to whether any of the nearest transformers that were identified in operation 212 have not been previously selected in operation 213 or in a previous iteration of operation 217. If any of the transformers identified in operation 212 have not been previously selected, the next one of the nearest transformers identified in operation 212 is selected in operation 217.

Then, operations 214-215 are repeated by comparing the voltage data from the suspected misallocated smart meter to the voltage data from the smart meters that are connected to the transformer selected in operation 217. Additional iterations of operations 214-217 are subsequently performed until the voltage data from the smart meters connected to each of the nearest transformers identified in operation 212 has been analyzed. In each of the iterations of operations 214-215, a set of flags may be generated by comparing the voltage data from the suspected misallocated smart meter to the voltage data from the smart meters connected to one of the nearest transformers identified in operation 212.

If in decision operation 216, a determination is made that all of the transformers identified in operation 212 have been selected in operation 213 or in previous iterations of operation 217, then operation 218 is performed. If the flags generated in one iteration of operations 214-215 are less than the flags generated for the suspected misallocated smart meter in operations 203-204, then in operation 218 the transformer that generated the least number of flags in operations 214-215 is identified for possible further analysis.

One possibility is that the suspected misallocated smart meter is connected to the transformer that generated the least number of flags in an iteration of operations 214-215 instead of the transformer selected in operation 201. The original transformer selected in operation 201 is the transformer that the utility's GIS data indicates is connected to the suspected misallocated smart meter. In or after operation 218, the suspected misallocated smart meter may, for example, be assigned to the transformer that generated the least number of flags in an iteration of operations 214-215. As a specific example that is not intended to be limiting, if 280 flags are generated in an iteration of operations 203-204 using smart meters connected to the original transformer, and only 3 flags are generated in an iteration of operations 214-215 using smart meters connected to one of the nearest transformers, then the suspected misallocated smart meter is assigned to that one of the nearest transformers.

Another possibility is that power theft may be occurring at the utility customer site having the suspected misallocated smart meter (e.g., using a bypass line around that smart meter). After operation 218, additional checks may be performed to determine if the suspected misallocated smart meter is connected to a different transformer than the original transformer selected in operation 201 or if power theft is occurring. A second check that may be performed to determine if the suspected misallocated smart meter is connected to a different transformer is disclosed herein with respect to FIGS. 5A-5B.

Figure 5A:
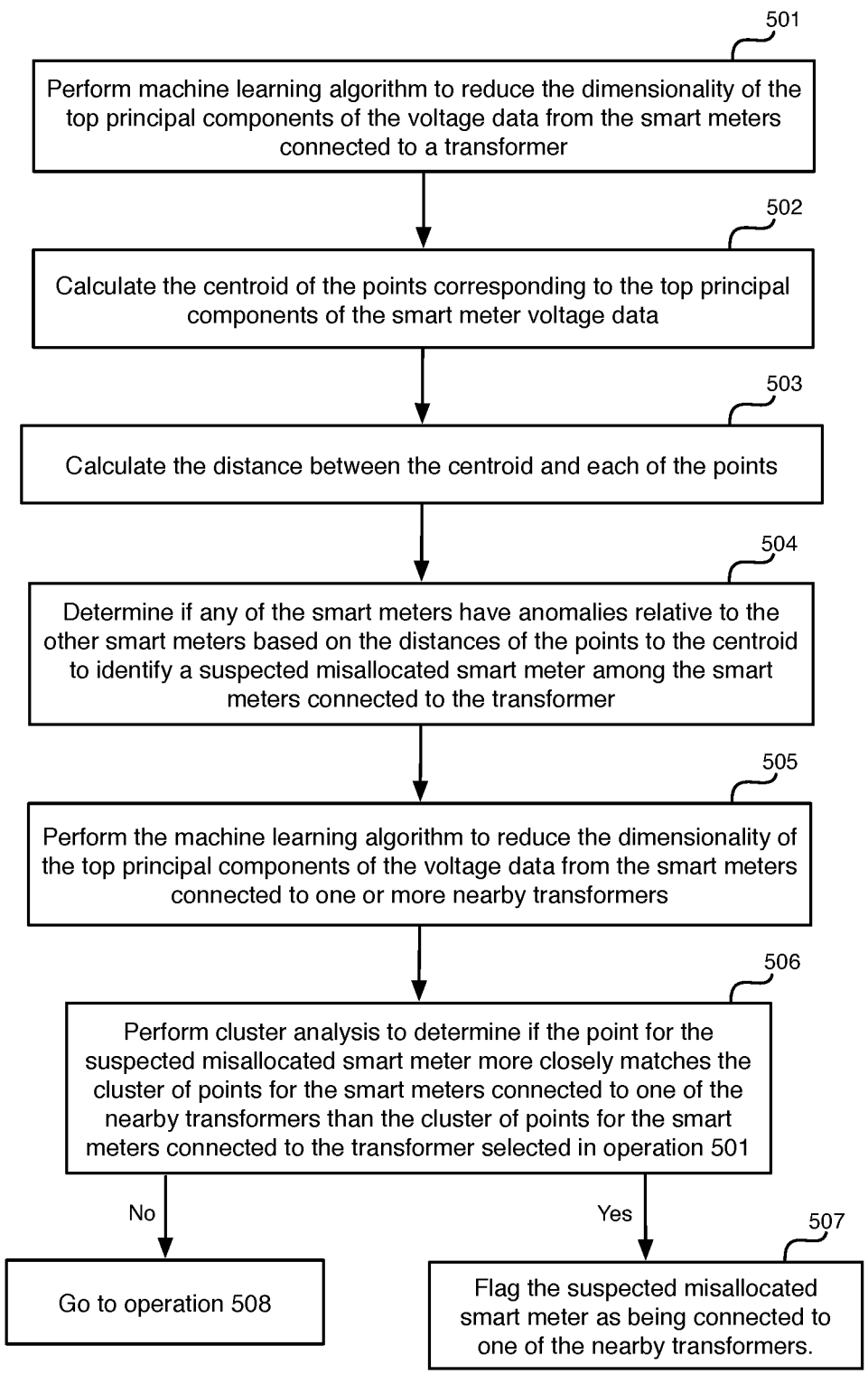
FIGS. 5A-5B illustrate flow charts showing examples of operations that can be performed to identify anomalies in data received from smart meters that are connected to an electric distribution system, according to an embodiment.
Figure 5B:
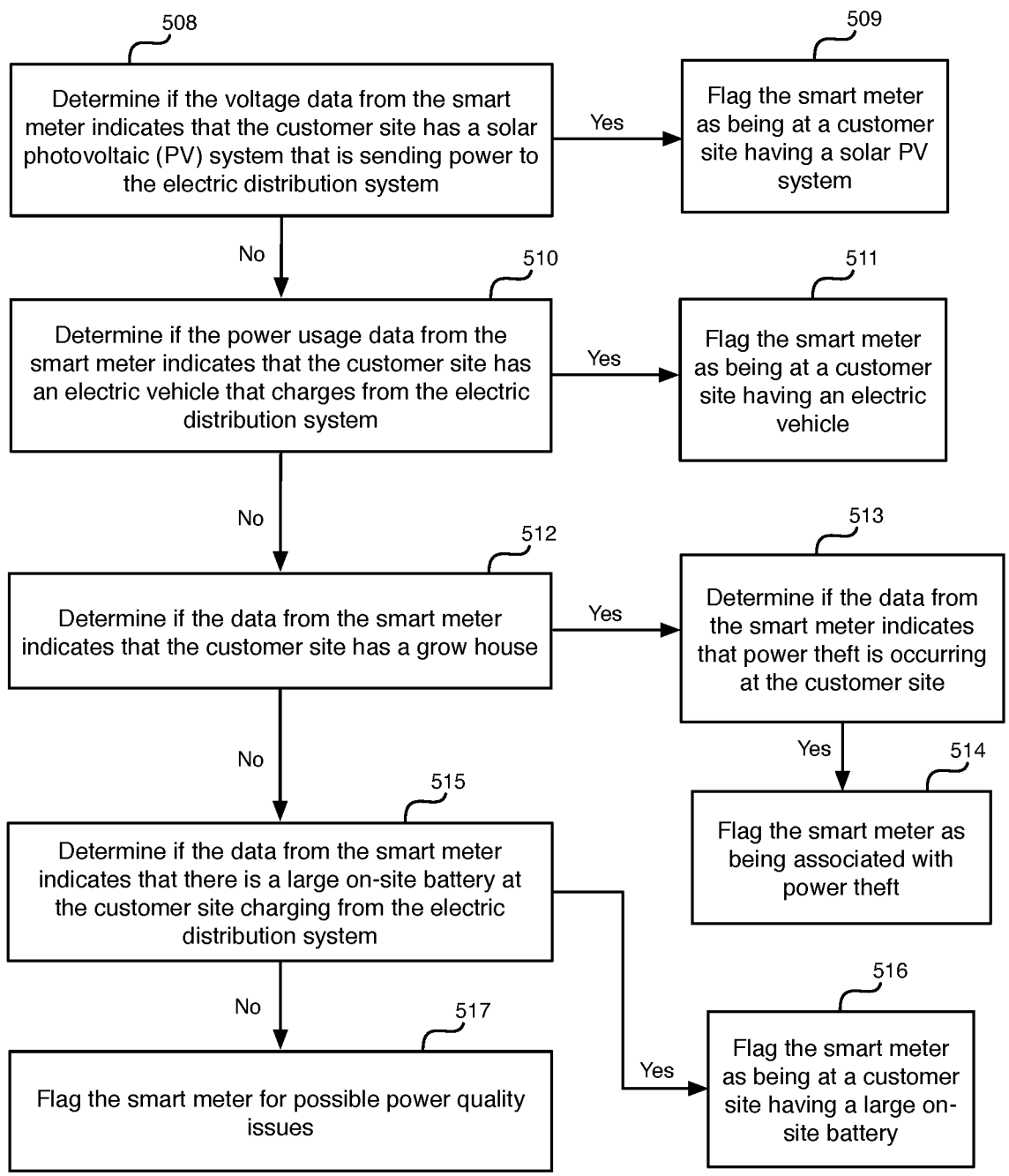

FIGS. 5A-5B illustrate flow charts showing examples of operations that can be performed to identify anomalies in voltage data received from smart meters that are connected to an electric grid, according to an embodiment. The operations of FIGS. 5A-5B may, for example, be performed as a second check to confirm the anomalies in the smart meter voltage data that were identified using the operations of FIGS. 2A-2B. Thus, in some exemplary embodiments, operations of FIGS. 2A-2B are performed as a first check to identify anomalies in voltage data received from smart meters, and operations of FIGS. 5A-5B are performed as a second check to confirm any anomalies identified in the first check. Thus, in some embodiments, a computer system, such as computer system 104, may perform the operations of FIGS. 2A-2B and the operations of FIGS. 5A-5B.

There may be some situations in which a smart meter's voltage data more closely matches the voltage data of smart meters connected to a different transformer than the transformer identified in the first check of FIGS. 2A-2B. Performing the operations of FIGS. 5A-5B as a second check may improve the accuracy of the process of identifying which smart meters are connected to different transformers or associated with power theft. The second check of FIGS. 5A-5B may be used to analyze more voltage data and/or allow for a faster analysis than the process of FIGS. 2A-2B.

Alternatively, the operations of FIGS. 5A-5B may be performed as a first check or alone without additional checks. In these embodiments, a computer system may perform some or all of the operations of FIGS. 5A-5B without the operations of FIGS. 2A-2B. The operations of FIGS. 5A-5B may, for example, be performed by the analytic software 114 in computer system 104 using I/O interfaces 111, processors 112, storage devices 113, and database 115 shown in FIG. 1.

In operation 501, a machine learning algorithm is performed to reduce the dimensionality of the top principal components of the voltage data from the smart meters connected to a transformer. The transformer selected for analysis in operation 501 may be any distribution transformer in the electric grid. As an example, operations 501-504 of FIG. 5A may be performed using voltage data from the smart meters connected to the transformer selected in operation 201.

In an exemplary embodiment of FIG. 5A, the existing smart meter to transformer connections are determined from the GIS data, and historic time series voltage data is collected for the smart meters spanning a selected period of time (e.g., days, weeks, or months). In order to diversify the voltage profiles, one transformer per feeder may be used to create a test sheet. The test sheet allows for greater exaggerations of the potential misallocation of smart meters. The slopes and magnitudes of the voltage data for each smart meter connected to a transformer are then calculated.

In an exemplary embodiment, the slopes and magnitudes of the voltage data for each smart meter are normalized and run through a principal component analysis (PCA). The PCA extracts the top principal components that uniquely identify each time series voltage waveform generated based on the smart meter voltage data. The top principal components typically have many more than 3 dimensions. After the top principal components are determined in this exemplary embodiment, they are run through a t-distribution stochastic nearest neighbor embedding (t-SNE) algorithm in operation 501 in order to reduce the dimensions of the top principal components down to two or three dimensions. T-SNE is a machine learning algorithm using a nonlinear dimensionality reduction technique that is suited for embedding high dimensional data for visualization in a low dimensional space of two or three dimensions. T-SNE can model a high-dimensional object by a two or three dimensional point in a graph in such a way that similar objects are modeled by nearby points in the graph and dissimilar objects are modeled by distant points in the graph with a high probability. The t-SNE algorithm can be used to determine a low dimensional point in a graph for each smart meter based on the top principal components of the voltage data from the respective smart meter that are extracted using PCA. The low dimensional points may be, for example, two dimensional (2D) points in a 2D graph or three dimensional points (3D) in a 3D graph. Each of the points generated by the t-SNE algorithm is a data point that represents data from one smart meter. The t-SNE algorithm may perform several iterations on the voltage data. As an example, the t-SNE algorithm may reduce the dimensionality of the hourly voltage data from the smart meters to three dimensional (3D) points on a 3D graph having 3 coordinates after about 1500 iterations.

Thus, for each smart meter connected to the transformer, a low dimensional point is generated in a graph for the top principal components of the voltage data from that smart meter. The points are then analyzed to identify outliers. In operation 502, the centroid of the points corresponding to the top principal components of the smart meter voltage data is calculated. After the centroid is calculated in operation 502, the distance between the centroid and each of the points is calculated in operation 503. As an example, the Mahalonobis distance technique may be used to calculate the distance between the centroid and each of these points. The distances calculated in operation 503 are then associated with their respective smart meters.

In operation 504, determine if any of the smart meters have anomalies relative to the other smart meters based on the distances of the points to the centroid to identify a suspected misallocated smart meter among the smart meters connected to the transformer. As an example, the smart meters may be ranked according to the distances of the points to the centroid calculated in operation 503 to determine if any of the smart meters is an outlier relative to the other smart meters connected to the transformer. The smart meter corresponding to the point having the greatest distance from the centroid may represent an anomaly, for example, if the distance of its corresponding point in the graph is greater than a threshold. The smart meter identified as representing an anomaly may, for example, be connected to a different transformer than the transformer selected in operation 501. As another example, the smart meter identified as representing an anomaly may be associated with power theft at the utility customer site. The smart meter determined to have an anomaly in operation 504 may be identified as a suspected misallocated smart meter.

In operation 505, the machine learning algorithm is performed to reduce the dimensionality of the top principal components of the voltage data from the smart meters connected to one or more transformers that are nearby the transformer selected in operation 501. As an example, operation 505 can be performed using the principal components of the voltage data from the smart meters connected to the transformer having the least flags identified in operation 218. As another example, operation 505 can be performed using the principal components of the voltage data from the smart meters connected to 2, 3, 4, 5, or more of the nearest transformers that are identified using the GIS data (e.g., as identified in operation 212).

Operation 505 may, for example, include normalizing and then running the slopes and magnitudes of the voltage data for each smart meter through a principal component analysis (PCA). The top principal components of the voltage data may then, for example, be run through a t-SNE algorithm in order to reduce the dimensions of the top principal components down to two or three dimensions. The top principal components in two or three dimensions are then used to generate a 2D or 3D point in a graph for each of the smart meters.

In operation 506, cluster analysis is performed to determine if the point for the suspected misallocated smart meter more closely matches the cluster of points for the smart meters connected to one of the nearby transformers than the cluster of points for the smart meters connected to the transformer selected in operation 501. As an example, a k nearest neighbors (KNN) algorithm may be used in operation 506 to perform unsupervised clustering of the dimension characteristics indicated by the 2D or 3D points in the graph generated in operations 501 and 505. The unsupervised clustering may determine if the point for the suspected misallocated smart meter more closely matches the cluster of points corresponding to one of the nearby transformers evaluated in operation 505 than the cluster of points corresponding to the transformer selected in operation 501.

If the computer system determines in operation 506 that the point for the suspected misallocated smart meter more closely matches the cluster of points for the smart meters connected to one of the nearby transformers than the cluster of points for the smart meters connected to the transformer selected in operation 501, the suspected misallocated smart meter is flagged as possibly being connected to that one of the nearby transformers in operation 507. The voltage profile of the suspected misallocated smart meter may then be compared with the voltage profiles of the smart meters connected to the possible matching nearby transformer for an additional check. Then, locations shown in the GIS data may be field verified to confirm the results. Additional iterations of the operations 501-506 of FIG. 5A can be performed using voltage data from the smart meters connected to the other transformers to be evaluated in the electric grid.

Figure 6:
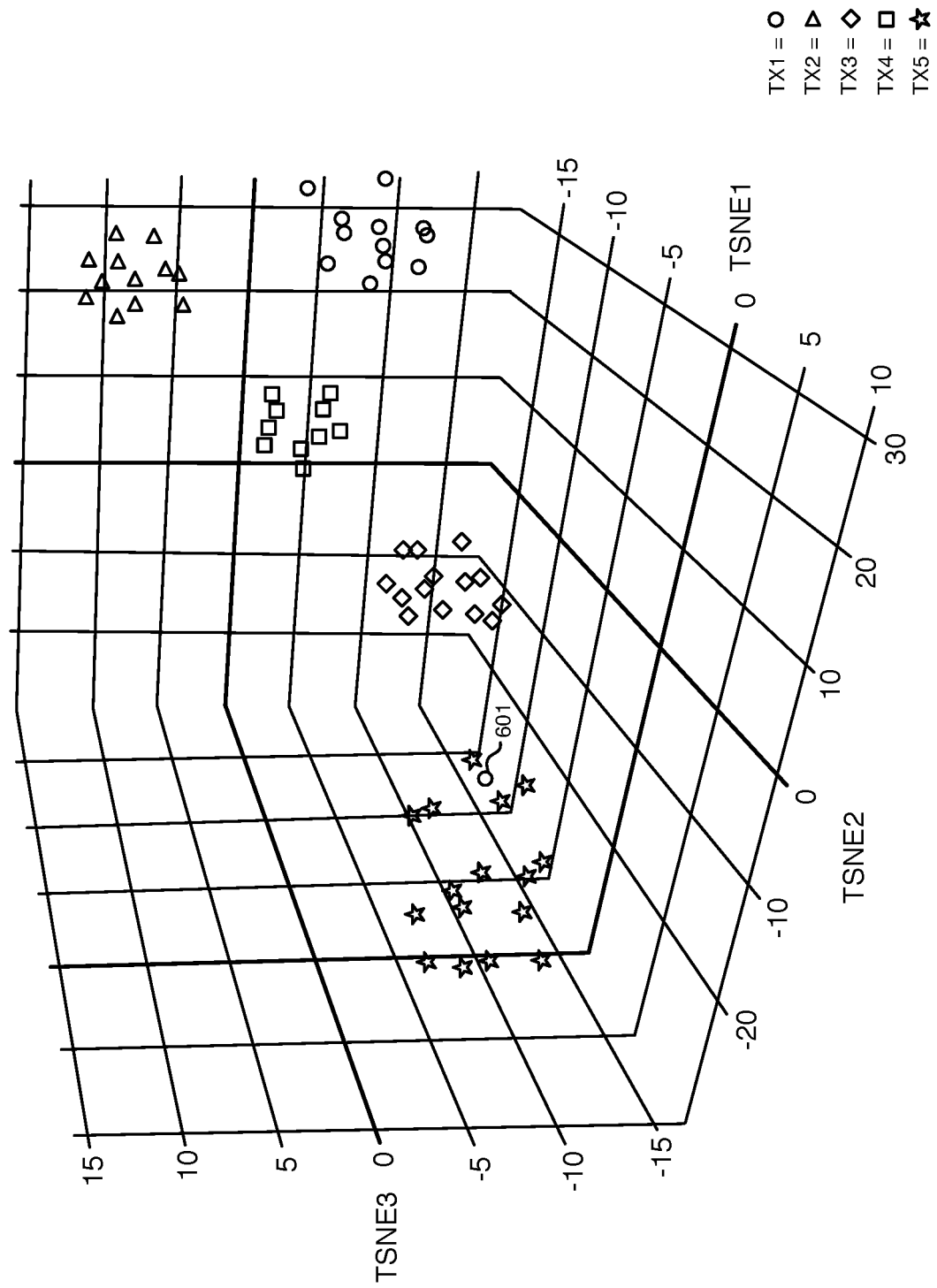
FIG. 6 is a three dimensional (3D) graph illustrating exemplary 3D points that represent the top principal components of the voltage data from the smart meters connected to 5 transformers, according to an exemplary embodiment.

FIG. 6 is a three dimensional (3D) graph illustrating exemplary 3D points that represent the top principal components of the voltage data from the smart meters connected to 5 transformers, according to an embodiment. The graph of FIG. 6 has three dimensions that are identified as TSNE1, TSNE 2, and TSNE3. The 5 transformers are identified as TX1, TX2, TX3, TX4, and TX5 in FIG. 6. The 3D points shown in FIG. 6 are generated using the top principal components of the voltage data from the smart meters connected to the transformer TX1 selected in operation 501 and from the smart meters connected to 4 nearby transformers TX2-TX5 identified in operation 505. In FIG. 6, 3D point 601 represents the top principal components of the voltage data from the suspected misallocated smart meter identified in operation 504. The 3D points of the top principal components of the voltage data from the smart meters connected to the 5 transformers TX1, TX2, TX3, TX4, and TX5 are indicated as circles, triangles, diamonds, squares, and stars, respectively, in FIG. 6.

In operation 506, cluster analysis may be performed on the data shown in FIG. 6 to determine which (if any) of the clusters of 3D points from the 5 transformers TX1-TX5 point 601 correlates with. As shown in FIG. 6, point 601 is an outlier compared to the points from the smart meters connected to transformers TX1-TX4. The nearest neighbors to point 601 are the points from the smart meters connected to transformer TX5. In the example of FIG. 6, the operations of FIG. 5A may indicate that the suspected misallocated smart meter is more closely correlated with data from the smart meters connected to transformer TX5 than to data from the smart meters connected to the transformer TX1 selected in operation 501. The suspected misallocated smart meter may then be reassigned to transformer TX5 in the example of FIG. 6.

In some embodiments, a visual inspection and a distance inspection may be performed on the smart meter voltage data as a third check after the operations of FIG. 5A. If a smart meter has been identified as a suspected misallocated smart meter in both check 1 (FIGS. 2A-2B) and check 2 (FIG. 5A), the third check may be performed to confirm the results. This third check is an optional check that may be included or omitted. In the third check, a software tool may subset the original transformer selected in operations 201 and 501 and find the one of the smart meters connected to the original transformer having a voltage profile that is nearest to the voltage profile of the suspected misallocated smart meter. The software tool may also subset the predicted transformer identified in operation 218 and/or operation 506 and find the one of the smart meters connected to the predicted transformer having a voltage profile that is nearest to the voltage profile of the suspected misallocated smart meter.

If the voltage profile of the suspected misallocated smart meter matches one of the smart meters connected to the predicted transformer more than any of the smart meters connected to the original transformer, then the predicted transformer may be confirmed to be connected to the suspected misallocated smart meter in the third check. This process of inspecting and matching the voltage profiles may be performed visually or automatically by the software tool. The software tool may display the physical distances between the smart meters as well as the voltage waveforms of all three smart meters in order to visually perform the visual and distance inspections. The three smart meters include the suspected misallocated smart meter, the smart meter connected to the original transformer having a voltage profile that is nearest to the suspected misallocated smart meter, and the smart meter connected to the predicted transformer having a voltage profile that is nearest to the suspected misallocated smart meter. The software tool used in the third check may, for example, be the analytic software 114 in computer system 104 that uses I/O interfaces 111, processors 112, storage devices 113, and database 115 shown in FIG. 1.

If the computer system determines in operation 506 that the point for the suspected misallocated smart meter more closely matches the cluster of points for the smart meters connected to the transformer selected in operation 501 than the cluster of points for the smart meters connected to one of the nearby transformers, the computer system proceeds to operation 508, which is shown in FIG. 5B. In operation 508, the computer system determines whether the voltage data from a smart meter indicates that the customer site has a solar photovoltaic (PV) system that is sending power to the electric distribution system. The smart meter analyzed in operations 508-517 may be the same smart meter analyzed in operations 501-507 or a different smart meter. The computer system may, for example, perform an iteration of operations 508-517 for each of the smart meters connected to a transformer or in a local area or for each of a subset of the smart meters connected to a transformer or in a local area.

A solar PV system typically increases the voltage measured by the smart meter at the customer site during times of solar power generation. A solar PV system typically has an inverter that converts direct current (DC) power generated from PV fuel cells to alternating current (AC). The solar PV system can then send power back to the electric distribution system, for example, at a nominal voltage of 240 volts. Typically, a smart meter measures a voltage anomaly in response to receiving power generated by a solar PV system.

The voltage data from the smart meter can be analyzed to determine if the voltage repeatedly increases more than the voltages from other smart meters in the same area during mid-day hours. As an example, if there are 7 smart meters connected to a transformer, 6 of the 7 smart meters measure voltages of 242-243 volts at solar noon, and the seventh smart meter measures a voltage of 246-247 volts at solar noon, then the computer system can conclude that the seventh smart meter is at a customer site that has a solar PV system.

Figure 7:
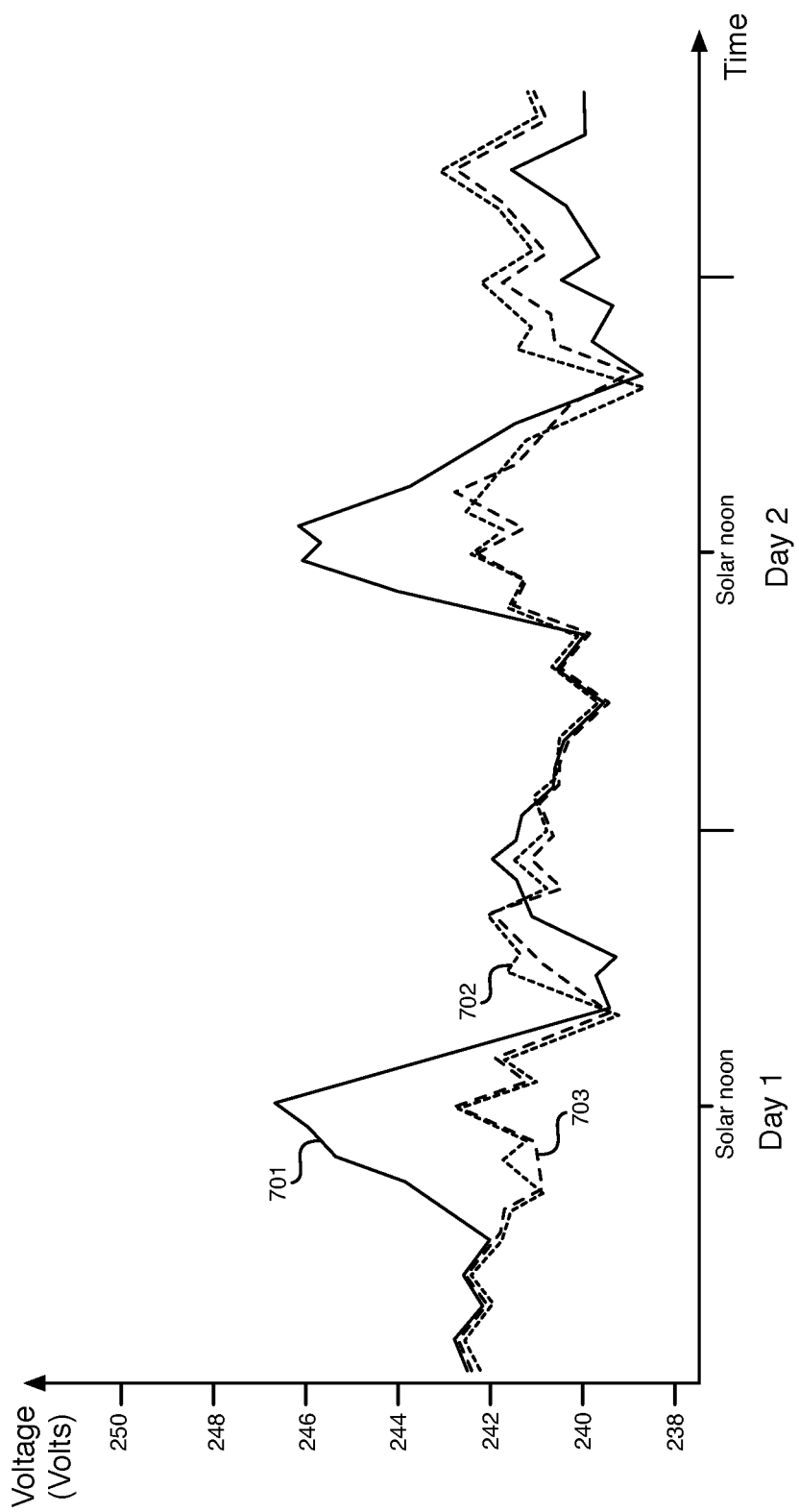
FIG. 7 illustrates an example of a voltage profile from a smart meter that indicates solar panels at a customer site that are sending power to an electric distribution system during daylight hours, according to an embodiment.

An example of a voltage profile from a smart meter that indicates a solar PV system at a customer site is sending power to the electric distribution system during daylight hours is shown in FIG. 7. As shown in FIG. 7, the voltage measured by a smart meter at a customer site having a solar PV system (shown by solid line 701) increases substantially more during the mid-day hours of each day around solar noon than the voltages from other smart meters in the same local area. Dotted lines 702-703 are examples of voltage data from two of the other smart meters in the same local area that measure smaller voltages during the mid-day hours.

If the computer system determines that the voltage data from the smart meter indicates that the customer site has a solar PV system in operation 508, then the smart meter is flagged in operation 509 as being at a customer site having a solar PV system. If the computer system determines that the voltage data from the smart meter indicates that the customer site does not have a solar PV system in operation 508, then the computer system proceeds to operation 510.

In operation 510, the computer system determines if the power usage data from the smart meter indicates that the customer site has an electric vehicle that charges from the electric distribution system. An electric vehicle (e.g., an electric automobile) typically generates a unique pattern of drawing power to charge its battery, compared to other types of devices used in residences. An electric vehicle (EV) typically ramps up its usage of power very quickly after the EV is plugged into an outlet and connected to the electric distribution system. Fast chargers for electric vehicles (EVs) ramp up their power draw even more quickly. Also, EVs generally draw substantially more power when they are charging compared to other types of devices used in residences. As the battery in an EV is close to being in a fully charged state, the power drawn by the EV drops off quickly.

Most drivers of electric vehicles (EVs) charge their EVs soon after they return home from driving their EVs. For example, many EV drivers charge their EVs after work hours. As another example, some EV drivers charge their EVs late at night or in the early morning hours to take advantage of lower electricity rates. The pattern of charging an EV at a customer site is often repeated several days over a week, multiple weeks, or a month, but the charging pattern may not occur everyday. The computer system can analyze power usage data from the smart meter to determine if the power usage repeatedly increases substantially more than the power usage measured by other smart meters in the same area during certain times of the day over a multiple day period (e.g., weeks or months). The power usage data from the smart meter can also indicate what type of EV is causing the increased power usage, because different types of EVs generate different power usage profiles based on their charging patterns. The power usage data from the smart meter can even indicate the distance the driver of the EV drove before re-charging the EV, e.g., based on the duration of time to re-charge the EV.

Figure 8A:
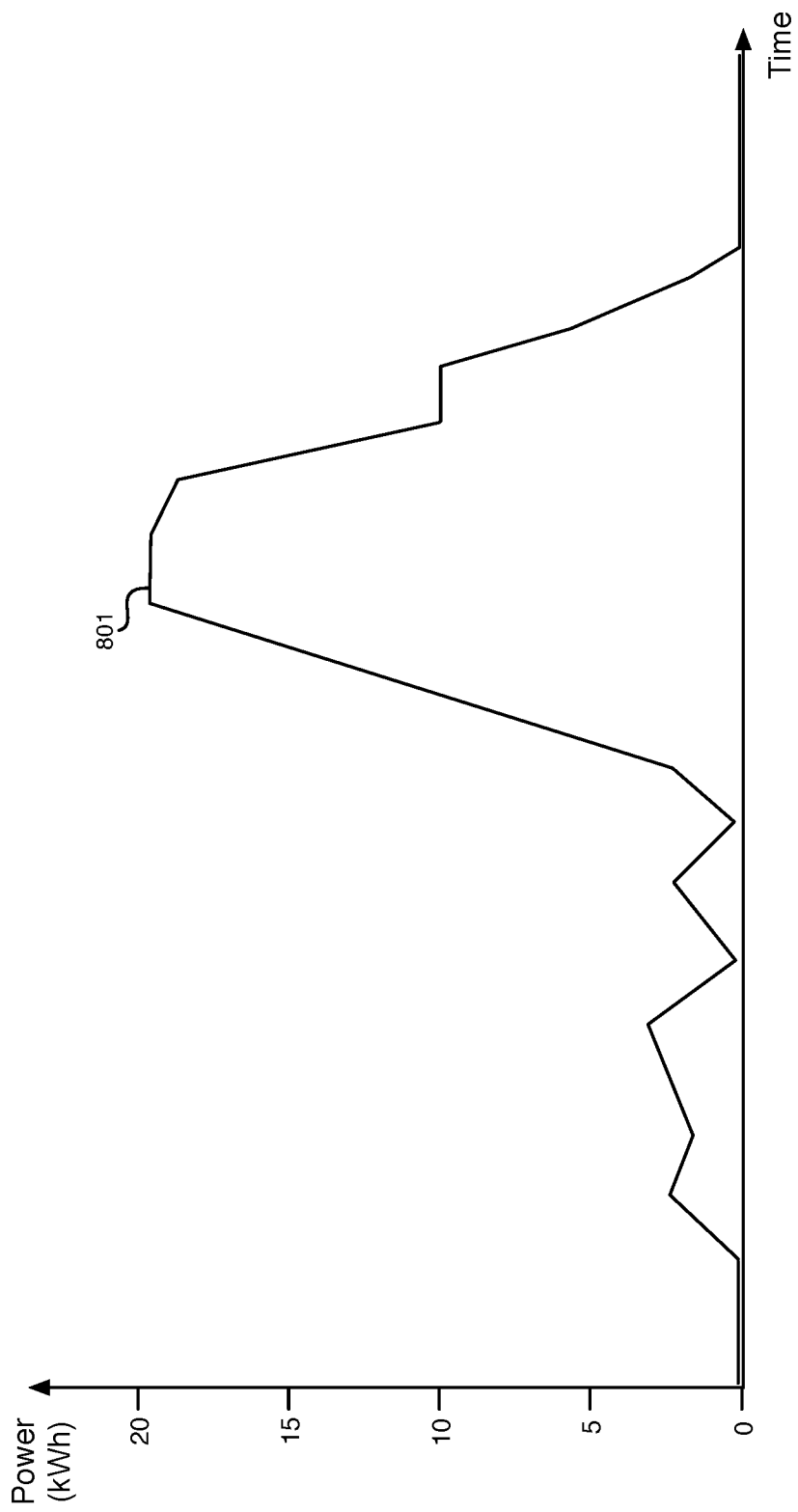
FIG. 8A is a graph that illustrates power usage measured by a smart meter over one day at a customer site having an electric vehicle, according to an embodiment.
Figure 8B:
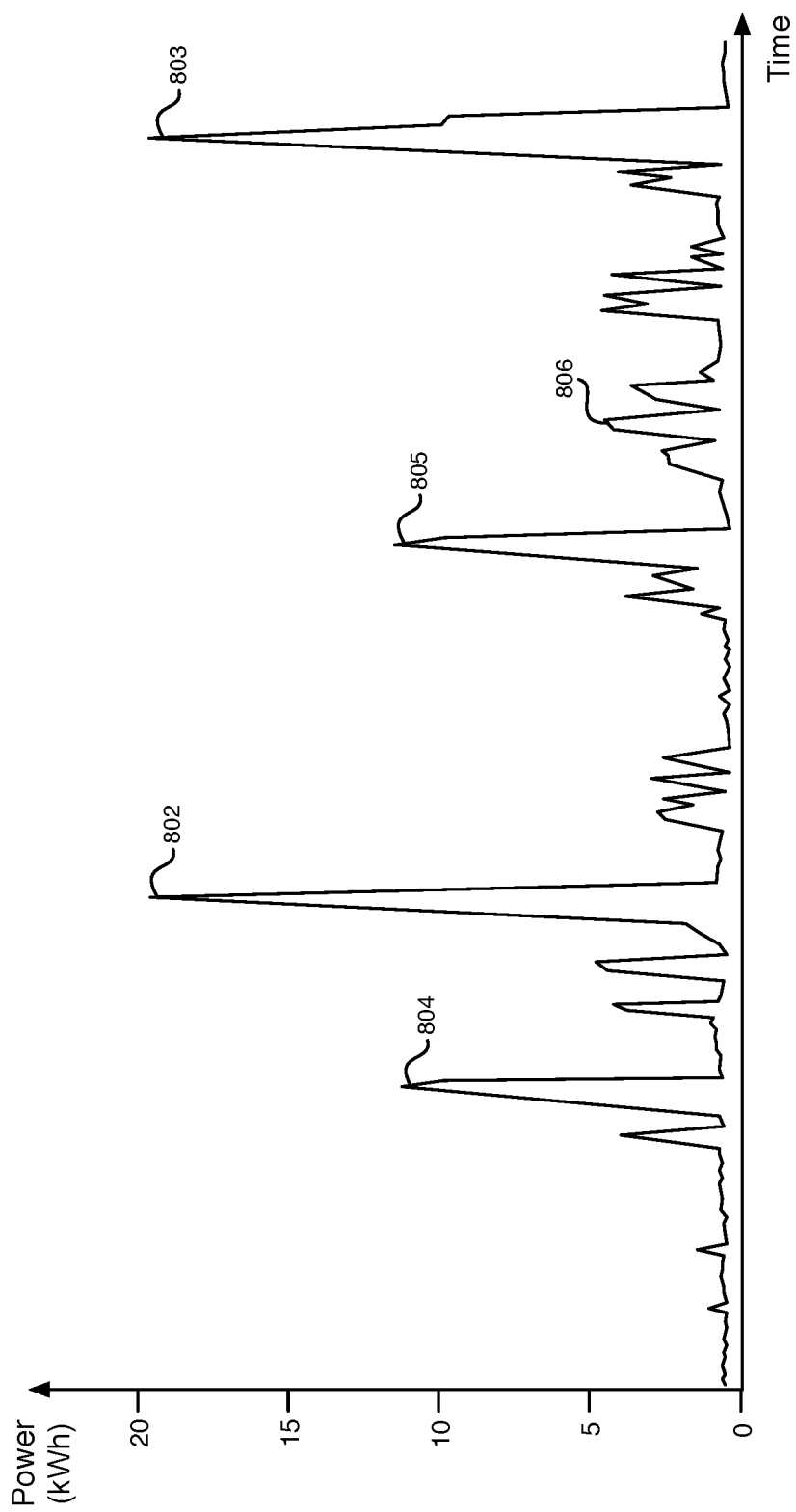
FIG. 8B is a graph that illustrates power usage measured by a smart meter at a customer site having an electric vehicle over several days, according to an embodiment.

FIG. 8A is a graph that illustrates power usage measured by a smart meter over one day at a customer site having an electric vehicle. As shown in FIG. 8A, the smart meter at a customer site having an EV measures a rapid increase in power usage (line 801) that peaks near 20 kilowatt hours (kWh) after the EV is plugged in, remains around 18-20 kWh for a few hours while the EV is charging, then decreases to 10 kWh for about an hour, and then to near 0 kWh. FIG. 8B is a graph that illustrates power usage from a smart meter at a customer site having an electric vehicle over several days. As shown in FIG. 8B, the smart meter at the customer site having an EV measures rapid increases (peaks 802-803) in power usage that peak around 20 kilowatt hours (kWh) on two days and rapid increases (peaks 804-805) that peak around 10-12 kWh on two other days that occur while an EV is charging. As specific examples that are not intended to be limiting, each of these peaks may last about 2 hours, and an EV charger can use from 15-80 Amperes of electric current. FIG. 8B shows power usage over about 8 days. In contrast, smart meters at customer sites not having EVs typically measure much smaller increases in power usage that may peak, for example, around 3-4 kWh on some days. Peak 806 in FIG. 8B is an example of a power usage peak that can be from non-EV power usage. The computer system in operation 510 can determine if the smart meter is at a customer site having an EV based on the power usage rapidly increasing to substantially more kWh than other smart meters in the area and then rapidly decreasing. The computer system in operation 510 can determine if this pattern of rapid spikes in power usage repeats over several days during a measured time period (e.g., multiple weeks or months) to confirm that the smart meter is at a customer site having one or more EVs.

If the computer system determines that the power usage data from the smart meter indicates that the customer site has an EV in operation 510, then the smart meter is flagged in operation 511 as being at a customer site having an EV. If the computer system determines that the power usage data from the smart meter indicates that the customer site does not have an EV in operation 510, then the computer system proceeds to operation 512.

In operation 512, the computer system determines if the data from the smart meter indicates that the customer site has a grow house. A grow house may, for example, be a building where a large number of plants (e.g., dozens, hundreds, or thousands) are being cultivated indoors under electric lighting. The plants may be, for example, marijuana plants or plants that are used to produce other types of controlled substances.

The power usage profile from a smart meter at a customer site having a grow house may, for example, look similar to a square wave. Often, the lights used for indoor cultivation draw a large amount of power load continuously for several hours per day (e.g., 6-10 hours), usually during night and early morning hours. In contrast, a typical air conditioning (AC) unit does not have a continuous, large draw of power for this long. If the amount of power usage associated with indoor cultivation is extreme in terms of the amount and duration of power usage (e.g., greater than 40 kWh), it can be easily separated from that of an AC or large motor. This large usage of power correlates with a voltage drop at the customer site that lasts for long periods of time (e.g., an average 7 hours per day).

The computer system in operation 512 can determine if the smart meter is at a grow house based on an increase in the power usage measured by the smart meter that is large and continuous (e.g., relative to the power measured by other smart meters in the area) and that occurs over several hours each day or on most days, particularly during the night or early morning hours. The amount of power drawn by a grow house may also indicate other information, such as what type of lights the grow house is using, how close the operators of the grow house are to harvesting, and/or how many plants are being grown at the grow house using known data regarding wattage and lumens of various types of lights and watts of lighting needed per plant over the plant's life cycle.

Figure 9:
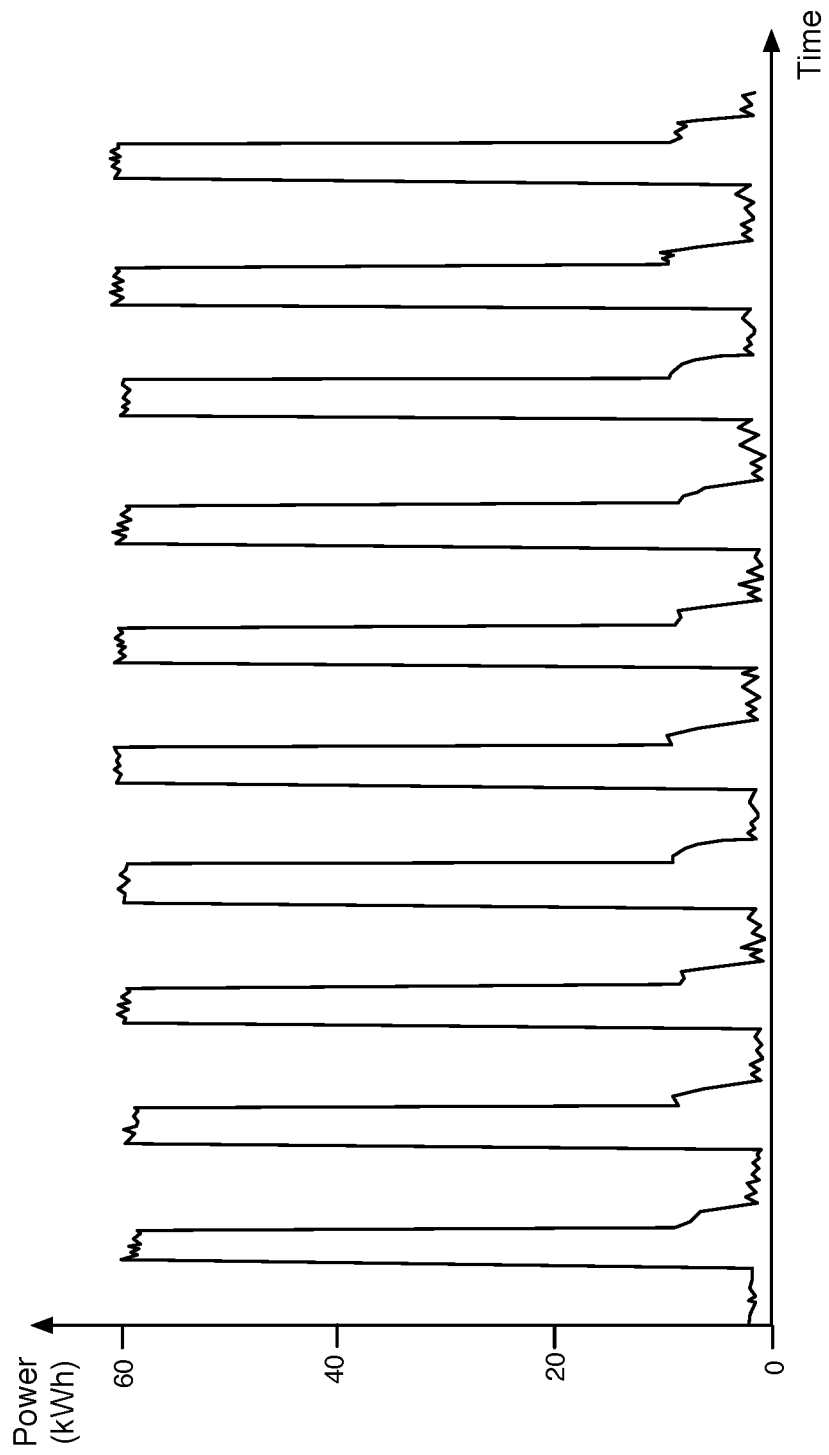
FIG. 9 is a graph that illustrates an example of power usage measured by a smart meter at a customer site having a grow house, according to an embodiment.

FIG. 9 is a graph that illustrates an example of power usage measured by a smart meter at a customer site having a grow house, according to an embodiment. In the example of FIG. 9, power usage at a grow house is shown over 10 days. In FIG. 9, power usage increases to around 60 kWh for about 7-8 hours each day when indoor lights for growing plants are turned on, and then decreases to about 1-4 kWh when these indoor lights are turned off. The large power usage may, for example, occur during the late night or early morning hours. FIG. 9 shows approximately 60 kWh maximum usage occurring each day merely as one example of a grow house. As other examples, the power usage at other grow houses may peak somewhere in the range of 30-70 kWh (or more) and remain within this range for 6-12 hours per day after falling back to a more typical power usage for the remainder of each day (e.g., 1-5 kWh).

As discussed above, the voltage profile sensed by an electric meter at a customer site may be indicative of power theft from the electric distribution system. If power theft is occurring at a customer site, the smart meter at that customer site may generate a different voltage profile than the voltage profiles generated by the smart meters at other customer sites in the same geographic area and/or that are connected to the same distribution transformer. For example, the voltage measured by a smart meter at a grow house may drop by 10-20 volts during several hours of the night and early morning. In contrast, the voltage measured by other smart meters connected to the same transformer or in the same area may drop by only a few volts or may be increasing during the same nighttime and early morning hours. If the voltage measured by a smart meter drops significantly more than the voltage measured by other smart meters in the same area or connected to the same transformer over several hours each day, then the computer system in operation 512 can determine that the smart meter is at a grow house.

If the computer system determines that data from the smart meter indicates that the customer site has a grow house in operation 512, the smart meter is flagged as being at a grow house. Then, in operation 513, the computer system determines if data from the smart meter indicates that power theft is occurring at the customer site. A specific example of how the computer system can determine if power theft is occurring at a customer site is described below.

If power theft is occurring at a customer site, the voltage drop between the smart meter at that customer site and the neatest distribution transformer typically does not correlate with the electric current or power usage measured by the smart meter at that customer site. The computer system can receive values indicating the instantaneous electric current measured by each smart meter connected to each distribution transformer. A smart meter can directly provide a measurement of electric current (in Amperes) to the computer system or can provide a measurement of power usage and voltage from which electric current can be calculated. The computer system can add together the electric current values received from all of the smart meters connected to a distribution transformer to determine the total electric current that is being drawn from that transformer to the smart meters.

An electric utility typically has resistance data about its electric distribution lines, such as the lengths of the distribution lines and the resistance of the distribution lines per unit of length. An electric utility also typically has data about the distribution transformers in its electric distribution system, including the resistance in the wire windings, magnetic core losses, and eddy current loss. The computer system can calculate the parasitic losses of a distribution transformer from the resistance in the wire windings, magnetic core losses, and eddy current loss. The computer system can use the parasitic losses for a transformer and the total electric current drawn from the transformer to calculate the voltage at the transformer. The computer system can use the electric current measured by each smart meter and the resistance data to calculate the voltage drop through each section of the distribution lines between the transformer and each of the smart meters. Typically, the voltage drop between the transformer and a smart meter as calculated by the computer system using the electric current measured by the smart meter matches the voltage drop between the transformer and the voltage measured by that smart meter.

If the voltage drop between the transformer and the voltage measured by any of the smart meters does not match the respective voltage drop calculated by the computer system using the measured electric current, the computer system can then calculate the amount of electric current that would cause the voltage drop between the transformer and the voltage measured by that smart meter using the resistance data. The computer system then compares the electric current measured by the smart meter to the electric current calculated by the computer system using the voltage measured by the smart meter. If the electric current measured by the smart meter is substantially less than the electric current calculated by the computer system using the voltage measured by the smart meter, then the computer system flags the smart meter as being associated with power theft at that customer site in operation 514. As an example that is not intended to be limiting, the difference between the electric current measured by a smart meter and the electric current calculated by the computer system may be over 100 Amps at a customer site where power theft is occurring.

If the computer system determines that the data from the smart meter does not indicate that the customer site has a grow house in operation 512, then the computer system proceeds to operation 515. In operation 515, the computer system determines if the data from the smart meter indicates that there is a large on-site battery at the customer site charging from the electric distribution system. A large on-site battery may draw a significant amount of power while it is charging (e.g., for several hours) and may have a unique charging pattern. If the computer system determines in operation 515 that the data from the smart meter indicates that there is a large on-site battery at the customer site, then the smart meter is flagged in operation 516 as being at a customer site having a large on-site battery.

If the computer system determines in operation 515 that the data from the smart meter is not consistent with a large on-site battery at the customer site, then the computer system flags the smart meter for possible power quality issues in operation 517. Low power quality may be caused by numerous issues, such as overheated transformers or overloaded neutrals. The process of FIGS. 5A-5B can allow a utility to proactively identify power quality issues before they cause an outage, a fire, or property damage.

The following examples pertain to further embodiments. Example 1 is a computer system comprising at least one processor device, wherein the computer system is configured to: generate voltage waveforms based on time series voltage data received from first smart meters connected to a first transformer in an electric grid; identify as a first identified interval each time interval during which a polarity of a slope of the voltage waveform of a first one of the first smart meters is opposite to a polarity of slopes of the voltage waveforms of a majority of the first smart meters; and generate a flag for the first one of the first smart meters each time a magnitude of the slope of the voltage waveform of the first one of the first smart meters at one of the first identified intervals is an outlier compared to magnitudes of the slopes of the voltage waveforms of the majority of the first smart meters.

In Example 2, the computer system of Example 1 can optionally be further configured to: identify as a second identified interval each time interval during which a polarity of a slope of the voltage waveform of a second one of the first smart meters is opposite to the polarity of the slopes of the voltage waveforms of the majority of the first smart meters; and generate a flag for the second one of the first smart meters each time a magnitude of the slope of the voltage waveform of the second one of the first smart meters at one of the second identified intervals is an outlier by a threshold percentage compared to magnitudes of the slopes of the voltage waveforms of the majority of the first smart meters.

In Example 3, the computer system of any one of Examples 1-2 can optionally be further configured to: identify one of the first smart meters that is associated with a greatest number of the flags as a suspected misallocated smart meter; identify a second transformer that is nearby the first transformer in the electric grid; and generate voltage waveforms based on time series voltage data received from second smart meters connected to the second transformer.

In Example 4, the computer system of Example 3 can optionally be further configured to: identify as a second identified interval each time interval during which a polarity of a slope of the voltage waveform of the suspected misallocated smart meter is opposite to a polarity of slopes of voltage waveforms of a majority of the second smart meters; and generate a flag for the suspected misallocated smart meter each time a magnitude of the slope of the voltage waveform of the suspected misallocated smart meter at one of the second identified intervals is an outlier compared to magnitudes of the slopes of the voltage waveforms of the majority of the second smart meters.

In Example 5, the computer system of Example 4 can optionally be further configured to: identify a third transformer that is nearby the first transformer in the electric grid; and generate voltage waveforms based on time series voltage data received from third smart meters connected to the third transformer.

In Example 6, the computer system of Example 5 can optionally be further configured to: identify as a third identified interval each time interval during which a polarity of a slope of the voltage waveform of the suspected misallocated smart meter is opposite to a polarity of slopes of voltage waveforms of a majority of the third smart meters; and generate a flag for the suspected misallocated smart meter each time a magnitude of the slope of the voltage waveform of the suspected misallocated smart meter is an outlier at one of the third identified intervals compared to magnitudes of the slopes of the voltage waveforms of the majority of the third smart meters.

In Example 7, the computer system of any one of Examples 1-6 can optionally be further configured to: perform a machine learning algorithm to reduce dimensionality of top principal components of the time series voltage data from the first smart meters to generate first points in a graph; calculate a centroid of the first points; calculate a distance of each of the first points to the centroid; and determine if any of the first smart meters have anomalies relative to the other ones of the first smart meters based on the distances of the first points to the centroid to identify a suspected misallocated smart meter from among the first smart meters.

In Example 8, the computer system of Example 7 can optionally be further configured to: perform the machine learning algorithm to reduce dimensionality of top principal components of additional time series voltage data from second smart meters connected to a second transformer that is nearby the first transformer in the electric grid to generate second points in the graph.

In Example 9, the computer system of Example 8 can optionally be further configured to: perform cluster analysis to determine if one of the first points that corresponds to the suspected misallocated smart meter more closely matches the second points for the second smart meters than the first points for the first smart meters.

Example 10 is a non-transitory computer readable storage medium storing instructions executable on a processor in a computer system, the executable instructions comprising: instructions executable to perform a machine learning algorithm to reduce dimensionality of top principal components of first time series voltage data received from first smart meters connected to a first transformer in an electric distribution system to generate first points in a graph, wherein each of the first points corresponds to one of the first smart meters; instructions executable to calculate a centroid of the first points; instructions executable to calculate a distance of each of the first points to the centroid; and instructions executable to determine if any of the first smart meters have anomalies relative to the other ones of the first smart meters based on the distances of the first points to the centroid to identify a suspected misallocated smart meter from among the first smart meters.

In Example 11, the non-transitory computer readable storage medium of Example 10 can optionally further comprise: instructions executable to perform the machine learning algorithm to reduce dimensionality of top principal components of second time series voltage data received from second smart meters connected to a second transformer that is nearby the first transformer in the electric distribution system to generate second points in the graph, wherein each of the second points corresponds to one of the second smart meters.

In Example 12, the non-transitory computer readable storage medium of any one of Examples 10-11 can optionally further include wherein the machine learning algorithm is a t-distribution stochastic nearest neighbor embedding algorithm, and/or wherein the first and second points are three dimensional points.

In Example 13, the non-transitory computer readable storage medium of any one of Examples 11-12 can optionally further comprise: instructions executable to perform cluster analysis to determine if one of the first points that corresponds to the suspected misallocated smart meter more closely matches a cluster of the second points for the second smart meters than a cluster of the first points for the first smart meters.

In Example 14, the non-transitory computer readable storage medium of Example 13 can optionally further include wherein the cluster analysis includes a k nearest neighbors algorithm that performs unsupervised clustering of dimension characteristics indicated by the first and second points.

In Example 15, the non-transitory computer readable storage medium of any one of Examples 10-14 can optionally further comprise: instructions executable to extract the top principal components that identify time series voltage waveforms generated based on the first time series voltage data for the first smart meters using a principal component analysis.

Example 16 is a method for identifying outliers in time series voltage data received from smart meters in an electric distribution system using at least one processor circuit in a computer system, the method comprising: generating a voltage waveform for each of first smart meters connected to a first transformer in the electric distribution system based on first time series voltage data received from the first smart meters; identifying as a first identified interval each predefined time interval during which a polarity of a slope of the voltage waveform of a first one of the first smart meters is opposite to a polarity of slopes of the voltage waveforms of a majority of the first smart meters; and generating a flag for the first one of the first smart meters each time a magnitude of the slope of the voltage waveform of the first one of the first smart meters at one of the first identified intervals is an outlier compared to magnitudes of the slopes of the voltage waveforms of the majority of the first smart meters.

In Example 17, the method of Example 16 can optionally further comprise: identifying one of the first smart meters that is associated with a greatest number of the flags as a suspected misallocated smart meter; identifying a second transformer that is nearby the first transformer in the electric distribution system; and generating a voltage waveform for each of second smart meters connected to the second transformer based on second time series voltage data received from the second smart meters.

In Example 18, the method of Example 17 can optionally further comprise: identifying as a second identified interval each predefined time interval during which a polarity of a slope of the voltage waveform of the suspected misallocated smart meter is opposite to a polarity of slopes of voltage waveforms of a majority of the second smart meters; and generating a flag for the suspected misallocated smart meter each time a magnitude of the slope of the voltage waveform of the suspected misallocated smart meter at one of the second identified intervals is an outlier compared to magnitudes of the slopes of the voltage waveforms of the majority of the second smart meters.

In Example 19, the method of Example 18 can optionally further comprise: identifying a third transformer that is nearby the first transformer in the electric distribution system; and generating a voltage waveform for each of third smart meters connected to the third transformer based on third time series voltage data received from the third smart meters.

In Example 20, the method of Example 19 can optionally further comprises: identifying as a third identified interval each predefined time interval during which a polarity of a slope of the voltage waveform of the suspected misallocated smart meter is opposite to a polarity of slopes of voltage waveforms of a majority of the third smart meters; and generating a flag for the suspected misallocated smart meter each time a magnitude of the slope of the voltage waveform of the suspected misallocated smart meter at one of the third identified intervals is an outlier compared to magnitudes of the slopes of the voltage waveforms of the majority of the third smart meters.

Example 21 is a non-transitory computer readable storage medium including instructions that, when executed by a processor circuit, cause the processor circuit to implement any of Examples 1-9 or 16-20.

Example 22 is a computer system to implement any of Examples 10-20.

Example 23 is a method to implement any of Examples 1-15.

Example 24 is a computer system comprising at least one processor device, wherein the computer system is configured to: determine if voltage data received from a smart meter connected to an electric distribution system indicates that the smart meter is located at a customer site having a solar photovoltaic system that is sending power to the electric distribution system; determine if data indicating power usage received from the smart meter indicates that the smart meter is located at a customer site having an electric vehicle that charges from the electric distribution system; determine if the voltage data or the data indicating power usage received from the smart meter indicates that the smart meter is located at a grow house that uses substantially more power than other smart meters in a local area; and determine if the voltage data and the data indicating power usage received from the smart meter indicates that the power usage of the smart meter accounts for voltage drops measured by the smart meter to identify power theft.

In Example 25, the computer system of Example 24 can optionally include wherein the computer system is further configured to determine if voltage data received from the smart meter indicates that the smart meter is located at a customer site having a solar photovoltaic system by analyzing the voltage data from the smart meter to determine if voltage measured by the smart meter repeatedly increases more than voltages from at least some of the other smart meters in the local area during mid-day hours of multiple days of a multiple day period.

In Example 26, the computer system of any one of Examples 24-25 can optionally include wherein the computer system is further configured to determine if the data indicating power usage received from the smart meter indicates that the smart meter is located at a customer site having an electric vehicle by determining if the power usage increases rapidly, draws substantially more power than most of the other smart meters in the local area, and then decreases rapidly during multiple days of a multiple day period.

In Example 27, the computer system of any one of Examples 24-26 can optionally include wherein the computer system is further configured to determine if the voltage data or the data indicating power usage received from the smart meter indicates that the smart meter is located at a grow house by determining if the power usage is substantially and continuously larger than power usage indicated by the other smart meters in the local area for several hours of multiple days of a multiple day period.

In Example 28, the computer system of any one of Examples 24-27 can optionally include wherein the computer system is further configured to determine if the voltage data or the data indicating power usage from the smart meter indicates that the smart meter is located at a customer site having a large on-site battery that is charging from the electric distribution system, and wherein the processor device flags the smart meter as being associated with possible power quality issues if the voltage data or the data indicating power usage from the smart meter indicates that the smart meter is not located at a customer site having a large on-site battery.

Example 29 is a non-transitory computer readable storage medium including instructions that, when executed by one or more processor circuits, cause the one or more processor circuits to implement any of Examples 24-28.

Example 30 is a method to implement any of Examples 24-28.

Embodiments of the present invention may be implemented using hardware, software, a non-transitory computer-readable medium containing program instructions, or a combination thereof. Software implemented by embodiments of the present invention or results of the present invention can be stored in some form of a non-transitory computer-readable medium such as semiconductor memory devices, hard drive, CD-ROM, DVD, or other non-transitory media for subsequent purposes such as being executed or processed by a processor, being displayed to a user, etc. Also, software implemented according to the present invention or results of the present invention may be transmitted in a signal over a network. Results of the present invention can be used for various purposes such as being executed or processed by a processor, being displayed to a user, transmitted in a signal over a network, etc. It is intended that the scope of the present invention be limited not with this detailed description, but rather by the claims appended hereto.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A computer system comprising at least one processor device, wherein the computer system is configured to:
   generate voltage waveforms based on time series voltage data received from first smart meters that are indicated as being connected to a first transformer in an electric grid;

identify as a first identified interval each time interval during which a polarity of a slope of the voltage waveform of a first one of the first smart meters is opposite to a polarity of slopes of the voltage waveforms of a majority of the first smart meters; and generate a flag for the first one of the first smart meters each time a magnitude of the slope of the voltage waveform of the first one of the first smart meters at one of the first identified intervals is an outlier compared to magnitudes of the slopes of the voltage waveforms of the majority of the first smart meters.

2. The computer system of claim 1, wherein the computer system is further configured to:

identify as a second identified interval each time interval during which a polarity of a slope of the voltage waveform of a second one of the first smart meters is opposite to the polarity of the slopes of the voltage waveforms of the majority of the first smart meters; and generate a flag for the second one of the first smart meters each time a magnitude of the slope of the voltage waveform of the second one of the first smart meters at one of the second identified intervals is an outlier by a threshold percentage compared to the magnitudes of the slopes of the voltage waveforms of the majority of the first smart meters.

3. The computer system of claim 1, wherein the computer system is further configured to:

identify one of the first smart meters that is associated with a greatest number of the flags as a suspected misallocated smart meter;

identify a second transformer that is nearby the first transformer in the electric grid; and generate voltage waveforms based on time series voltage data received from second smart meters connected to the second transformer.

4. The computer system of claim 3, wherein the computer system is further configured to:

identify as a second identified interval each time interval during which a polarity of a slope of the voltage waveform of the suspected misallocated smart meter is opposite to a polarity of slopes of voltage waveforms of a majority of the second smart meters; and generate a flag for the suspected misallocated smart meter each time a magnitude of the slope of the voltage waveform of the suspected misallocated smart meter at one of the second identified intervals is an outlier compared to magnitudes of the slopes of the voltage waveforms of the majority of the second smart meters.

5. The computer system of claim 4, wherein the computer system is further configured to:

identify a third transformer that is nearby the first transformer in the electric grid; and generate voltage waveforms based on time series voltage data received from third smart meters connected to the third transformer.

6. The computer system of claim 5, wherein the computer system is further configured to:

identify as a third identified interval each time interval during which a polarity of a slope of the voltage waveform of the suspected misallocated smart meter is opposite to a polarity of slopes of voltage waveforms of a majority of the third smart meters; and generate a flag for the suspected misallocated smart meter each time a magnitude of the slope of the voltage waveform of the suspected misallocated smart meter is an outlier at one of the third identified intervals compared to magnitudes of the slopes of the voltage waveforms of the majority of the third smart meters.

7. The computer system of claim 1, wherein the computer system is further configured to:

perform a machine learning algorithm to reduce dimensionality of top principal components of the time series voltage data received from the first smart meters to generate first points in a graph;

calculate a centroid of the first points;

calculate a distance of each of the first points to the centroid; and determine if any of the first smart meters has anomalies relative to the other ones of the first smart meters based on the distances of the first points to the centroid to identify a suspected misallocated smart meter from among the first smart meters.

8. The computer system of claim 7, wherein the computer system is further configured to:

perform the machine learning algorithm to reduce dimensionality of top principal components of time series voltage data received from second smart meters connected to a second transformer that is nearby the first transformer in the electric grid to generate second points in the graph.

9. The computer system of claim 8, wherein the computer system is further configured to:

perform cluster analysis to determine if one of the first points that corresponds to the suspected misallocated smart meter more closely matches the second points for the second smart meters than the first points for the first smart meters.

10. A non-transitory computer readable storage medium storing instructions executable on a processor in a computer system, the executable instructions comprising:

instructions executable to perform a machine learning algorithm to reduce dimensionality of top principal components of first time series voltage data received from first smart meters connected to a first transformer in an electric distribution system to generate first points in a graph, such that the first time series voltage data has a first number of dimensions and the first points have only a second number of dimensions that is less than the first number of dimensions, and wherein each of the first points corresponds to one of the first smart meters;

instructions executable to calculate a centroid of the first points;

instructions executable to calculate a distance of each of the first points to the centroid; and instructions executable to determine if any of the first smart meters has anomalies relative to the other ones of the first smart meters based on the distances of the first points to the centroid to identify a suspected misallocated smart meter from among the first smart meters.

11. The non-transitory computer readable storage medium of claim 10 further comprising:

instructions executable to perform the machine learning algorithm to reduce dimensionality of top principal components of second time series voltage data received from second smart meters connected to a second transformer that is nearby the first transformer in the electric distribution system to generate second points in the graph, wherein each of the second points corresponds to one of the second smart meters.

12. The non-transitory computer readable storage medium of claim 11, wherein the machine learning algorithm is a t-distribution stochastic nearest neighbor embedding algorithm, and wherein the first and second points are three dimensional points.

13. The non-transitory computer readable storage medium of claim 11 further comprising:
instructions executable to perform cluster analysis to determine if one of the first points that corresponds to the suspected misallocated smart meter more closely matches a cluster of the second points for the second smart meters than a cluster of the first points for the first smart meters.

14. The non-transitory computer readable storage medium of claim 13, wherein the cluster analysis comprises a k nearest neighbors algorithm that performs unsupervised clustering of dimension characteristics indicated by the first and second points.

15. The non-transitory computer readable storage medium of claim 10 further comprising:
instructions executable to extract the top principal components that identify time series voltage waveforms generated based on the first time series voltage data for the first smart meters using a principal component analysis.

16. A method for identifying outliers in time series voltage data received from smart meters in an electric distribution system using at least one processor circuit in a computer system, the method comprising:
generating a voltage waveform for each of first smart meters that are identified as being connected to a first transformer in the electric distribution system based on first time series voltage data received from the first smart meters;
identifying as a first identified interval each predefined time interval during which a polarity of a slope of the voltage waveform of a first one of the first smart meters is opposite to a polarity of slopes of the voltage waveforms of a majority of the first smart meters; and
generating a flag for the first one of the first smart meters each time a magnitude of the slope of the voltage waveform of the first one of the first smart meters at one of the first identified intervals is an outlier compared to magnitudes of the slopes of the voltage waveforms of the majority of the first smart meters.

17. The method of claim 16 further comprising:
identifying one of the first smart meters that is associated with a greatest number of the flags as a suspected misallocated smart meter;
identifying a second transformer that is nearby the first transformer in the electric distribution system; and
generating a voltage waveform for each of second smart meters connected to the second transformer based on second time series voltage data received from the second smart meters.

18. The method of claim 17 further comprising:
identifying as a second identified interval each predefined time interval during which a polarity of a slope of the voltage waveform of the suspected misallocated smart meter is opposite to a polarity of slopes of voltage waveforms of a majority of the second smart meters; and
generating a flag for the suspected misallocated smart meter each time a magnitude of the slope of the voltage waveform of the suspected misallocated smart meter at one of the second identified intervals is an outlier compared to magnitudes of the slopes of the voltage waveforms of the majority of the second smart meters.

19. The method of claim 18 further comprising:
identifying a third transformer that is nearby the first transformer in the electric distribution system; and
generating a voltage waveform for each of third smart meters connected to the third transformer based on third time series voltage data received from the third smart meters.

20. The method of claim 19 further comprising:
identifying as a third identified interval each predefined time interval during which a polarity of a slope of the voltage waveform of the suspected misallocated smart meter is opposite to a polarity of slopes of voltage waveforms of a majority of the third smart meters; and
generating a flag for the suspected misallocated smart meter each time a magnitude of the slope of the voltage waveform of the suspected misallocated smart meter at one of the third identified intervals is an outlier compared to magnitudes of the slopes of the voltage waveforms of the majority of the third smart meters.

21. A computer system comprising at least one processor device, wherein the computer system is configured to:
reduce dimensionality of principal components of first time series voltage data received from first smart meters connected to a first transformer in an electric distribution system to generate first points in a graph, wherein the first time series voltage data has a first number of dimensions, wherein the first points have only a second number of dimensions that is less than the first number of dimensions, and wherein each of the first points corresponds to one of the first smart meters;
calculate a centroid of the first points;
calculate a distance of each of the first points to the centroid; and
determine if any of the first smart meters has anomalies relative to the other ones of the first smart meters based on the distances of the first points to the centroid to identify a suspected misallocated smart meter from among the first smart meters.

22. The computer system of claim 21, wherein the computer system is further configured to:
reduce dimensionality of principal components of second time series voltage data received from second smart meters connected to a second transformer that is nearby the first transformer in the electric distribution system to generate second points in the graph, wherein the second time series voltage data has a third number of dimensions, wherein the second points have only the second number of dimensions that is less than the third number of dimensions, and wherein each of the second points corresponds to one of the second smart meters.

23. The computer system of claim 22, wherein the computer system is further configured to:
perform cluster analysis to determine if one of the first points that corresponds to the suspected misallocated smart meter more closely matches a cluster of the second points for the second smart meters than a cluster of the first points for the first smart meters.

* * * * *